US00RE46957E

(19) United States
(12) Reissued Patent
Mikajiri et al.

(10) Patent Number: US RE46,957 E
(45) Date of Reissued Patent: Jul. 17, 2018

(54) NONVOLATILE SEMICONDUCTOR MEMORY DEVICE

(71) Applicant: TOSHIBA MEMORY CORPORATION, Minato-ku (JP)

(72) Inventors: Yoshimasa Mikajiri, Kanagawa-ken (JP); Ryouhei Kirisawa, Kanagawa-ken (JP); Masaru Kito, Kanagawa-ken (JP); Shigeto Oota, Mie-ken (JP)

(73) Assignee: TOSHIBA MEMORY CORPORATION, Minato-ku (JP)

(21) Appl. No.: 14/296,237

(22) Filed: Jun. 4, 2014

Related U.S. Patent Documents

Reissue of:
(64) Patent No.: 8,194,467
Issued: Jun. 5, 2012
Appl. No.: 12/725,742
Filed: Mar. 17, 2010

(30) Foreign Application Priority Data

Sep. 16, 2009 (JP) ..... 2009-214116

(51) Int. Cl.
*G11C 16/04* (2006.01)
*H01L 29/792* (2006.01)
(Continued)

(52) U.S. Cl.
CPC ..... *G11C 16/0466* (2013.01); *G11C 5/02* (2013.01); *H01L 27/11573* (2013.01);
(Continued)

(58) Field of Classification Search
CPC ... G11C 16/0466; G11C 16/0483; G11C 5/02; H01L 27/11556; H01L 27/11573; H01L 27/11578
(Continued)

(56) References Cited

U.S. PATENT DOCUMENTS 7,847,342 B2 * 12/2010 Fukuzumi et al. ..... 257/324
7,910,973 B2 * 3/2011 Sakaguchi et al. ..... 257/298
(Continued)

FOREIGN PATENT DOCUMENTS

JP 6-68688 3/1994
JP 11-250677 9/1999
(Continued)

OTHER PUBLICATIONS

Office Action dated Jan. 5, 2012 in Japan Application No. 2009-214116 (With English Translation).

*Primary Examiner* — Joshua Campbell
(74) *Attorney, Agent, or Firm* — Oblon, McClelland, Maier & Neustadt, L.L.P.

(57) ABSTRACT

A nonvolatile semiconductor memory device includes: a memory unit; and a control unit. The memory unit includes: a multilayer structure including electrode films and inter-electrode insulating films alternately stacked; a semiconductor pillar piercing the multilayer structure; insulating films and a memory layer provided between the electrode films and the semiconductor pillar; and a wiring connected to the semiconductor pillar. In an erase operation, the control unit performs: a first operation setting the wiring at a first potential and the electrode film at a second potential lower than the first potential during a first period; and a second operation setting the wiring at a third potential and the electrode film at a fourth potential lower than the third potential during a second period after the first operation. A length of the second period is shorter than the first period, and/or a difference between the third and fourth potentials is smaller than a difference between the first and second potentials.

37 Claims, 16 Drawing Sheets

(51) Int. Cl.
*H01L 27/11573* (2017.01)
*H01L 27/11578* (2017.01)
*G11C 5/02* (2006.01)
*H01L 27/11556* (2017.01)

(52) U.S. Cl.
CPC .... *H01L 27/11578* (2013.01); *G11C 16/0483* (2013.01); *H01L 27/11556* (2013.01)

(58) Field of Classification Search
USPC ..... 365/185.29, 185.17, 185.18, 185.24, 365/185.26, 185.33, 185.06, 185.07; 257/324
See application file for complete search history.

(56) References Cited

U.S. PATENT DOCUMENTS

| | | | | |
|---|---|---|---|---|
| 7,910,979 | B2 * | 3/2011 | Matsuoka et al. | 257/324 |
| 7,936,004 | B2 * | 5/2011 | Kito et al. | 257/324 |
| 7,969,789 | B2 * | 6/2011 | Katsumata et al. | 365/185.28 |
| 8,013,383 | B2 * | 9/2011 | Kidoh et al. | 257/324 |
| 8,203,187 | B2 * | 6/2012 | Lung et al. | 257/390 |
| 8,743,624 | B2 * | 6/2014 | Lutze et al. | 365/185.29 |
| 2007/0158736 | A1 * | 7/2007 | Arai et al. | 257/315 |
| 2008/0067583 | A1 * | 3/2008 | Kidoh et al. | 257/326 |
| 2009/0146190 | A1 * | 6/2009 | Fukuzumi et al. | 257/204 |
| 2009/0268523 | A1 * | 10/2009 | Maejima | 365/185.11 |
| 2010/0002515 | A1 * | 1/2010 | Lutze | G11C 11/5635 365/185.17 |
| 2010/0118610 | A1 * | 5/2010 | Katsumata et al. | 365/185.18 |
| 2010/0181612 | A1 * | 7/2010 | Kito et al. | 257/319 |
| 2011/0013458 | A1 * | 1/2011 | Seol | 365/185.18 |
| 2011/0019486 | A1 * | 1/2011 | Jang et al. | 365/185.25 |

FOREIGN PATENT DOCUMENTS

| | | |
|---|---|---|
| JP | 2000-188384 | 7/2000 |
| JP | 2004-23044 | 1/2004 |
| JP | 2006-79802 | 3/2006 |
| JP | 2007-180389 | 7/2007 |
| JP | 2007-266143 | 10/2007 |
| JP | 2008-536249 | 9/2008 |
| JP | 2009-146954 | 7/2009 |

* cited by examiner

110

Vera1
Vera2
V01
V03
VBL/
VSL
(V00)
t

VeraG1
VeraG2
V05
V06
VSGD/
VSGS
(V00)
t

VWL
(V00)
V04,V02
t
TE1
TE2
t11 t12 t13 t14 t15 t16 t21 t22 t23 t24 t25 t26
E1
E2
EP

111
Vera1
Vera2
V01
V03
VBL/
VSL
(V00)
t

VeraG1
VeraG2
V05
V06
VSGD/
VSGS
(V00)
t

VWL
(V00)
V04,V02
t
TE1
TE2
t11 t12 t13 t14 t15 t16 t21 t22 t23 t24 t25 t26
E1
E2
EP

NONVOLATILE SEMICONDUCTOR MEMORY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is based upon and claims the benefit of priority from the prior Japanese Patent Application No. 2009-214116, filed on Sep. 16, 2009; the entire contents of which are incorporated herein by reference.

BACKGROUND

1. Field

Embodiments of this invention relate generally to a nonvolatile semiconductor memory device.

2. Background Art

A method for collectively processing a three-dimensional multilayer memory has been proposed to increase the memory capacity of a nonvolatile semiconductor memory device (memory) (see, e.g., JP-A 2007-266143 (Kokai)). In this method, a multilayer memory can be collectively formed irrespective of the number of stacked layers, and hence the increase of cost can be suppressed.

In this collectively processed three-dimensional multilayer memory, insulating films and electrode films (to serve as word lines) are alternately stacked to form a multilayer body, in which through holes are collectively provided. Then, a charge storage layer (memory layer) is provided on the side surface of the through hole, and silicon is filled inside the through hole to form a silicon pillar. A tunnel insulating film is provided between the charge storage layer and the silicon pillar, and a block insulating film is provided between the charge storage layer and the electrode film. Thus, a memory cell illustratively made of a MONOS (metal oxide nitride oxide semiconductor) transistor is formed at the intersection between each of the electrode films and the silicon pillar.

In such a collectively processed three-dimensional multilayer memory, further stabilization of its erase state has many advantages, such as higher controllability in the write operation.

A method of performing a plurality of erase loops as the erase operation has been proposed for a three-dimensional multilayer memory with planar memory cells simply stacked therein, not for the collectively processed three-dimensional multilayer memory as described above. However, because the structure and operating mechanism of memory cells are different from those in the collectively processed three-dimensional multilayer memory, this method is not directly applicable to the collectively processed three-dimensional multilayer memory. Thus, it is necessary to develop an operation method specific to the collectively processed three-dimensional multilayer memory.

SUMMARY

According to an aspect of the invention, there is provided a nonvolatile semiconductor memory device including: a memory unit; and a control unit, the memory unit including: a multilayer structure including a plurality of electrode films and a plurality of interelectrode insulating films alternately stacked in a first direction; a first semiconductor pillar piercing the multilayer structure in the first direction; a first memory layer provided between each of the electrode films and the first semiconductor pillar; a first inner insulating film provided between the first memory layer and the first semiconductor pillar; a first outer insulating film provided between each of the electrode films and the first memory layer; and a first wiring electrically connected to one end of the first semiconductor pillar, the control unit performing: a first operation setting the first wiring at a first potential and setting the electrode film at a second potential lower than the first potential during a first period; and an operation including a second operation setting the first wiring at a third potential and setting the electrode film at a fourth potential lower than the third potential during a second period after the first operation, the operation including the second operation having at least one of: a length of the second period being shorter than a length of the first period; and a difference between the third potential and the fourth potential being smaller than a difference between the first potential and the second potential, the first operation and the operation including the second operation being performed in an operation for performing at least one of injection of holes into the first memory layer and extraction of electrons from the first memory layer.

According to another aspect of the invention, there is provided a nonvolatile semiconductor memory device including: a memory unit; and a control unit, the memory unit including: a multilayer structure including a plurality of electrode films and a plurality of interelectrode insulating films alternately stacked in a first direction; a semiconductor pillar piercing the multilayer structure in the first direction; a memory layer provided between each of the electrode films and the semiconductor pillar; an inner insulating film provided between the memory layer and the semiconductor pillar; an outer insulating film provided between each of the electrode films and the memory layer; and a wiring electrically connected to one end of the semiconductor pillar, and the control unit setting: the wiring at a first potential; and the electrode film opposed to one of memory sections of the memory layer facing the plurality of electrode films at a second potential lower than the first potential and the electrode film opposed to the memory section except the one of memory sections in a floating state, the setting being performed in an operation for performing at least one of injection of holes into the one memory section and extraction of electrons from the one memory section.

According to another aspect of the invention, there is provided a nonvolatile semiconductor memory device including: a memory unit; and a control unit, the memory unit including: a multilayer structure including a plurality of electrode films and a plurality of interelectrode insulating films alternately stacked in a first direction; a semiconductor pillar piercing the multilayer structure in the first direction; a memory layer provided between each of the electrode films and the semiconductor pillar; an inner insulating film provided between the memory layer and the semiconductor pillar; an outer insulating film provided between each of the electrode films and the memory layer; and a wiring electrically connected to one end of the semiconductor pillar, and the control unit setting: the wiring at a first potential one electrode film of the plurality of electrode films at a second potential lower than the first potential; and another electrode film of the plurality of electrode films at a seventh potential lower than the first potential and different from the second potential, the setting being performed in an operation for performing at least one of injection of holes into the memory layer and extraction of electrons from the memory layer.

DETAILED DESCRIPTION

Figure 1:
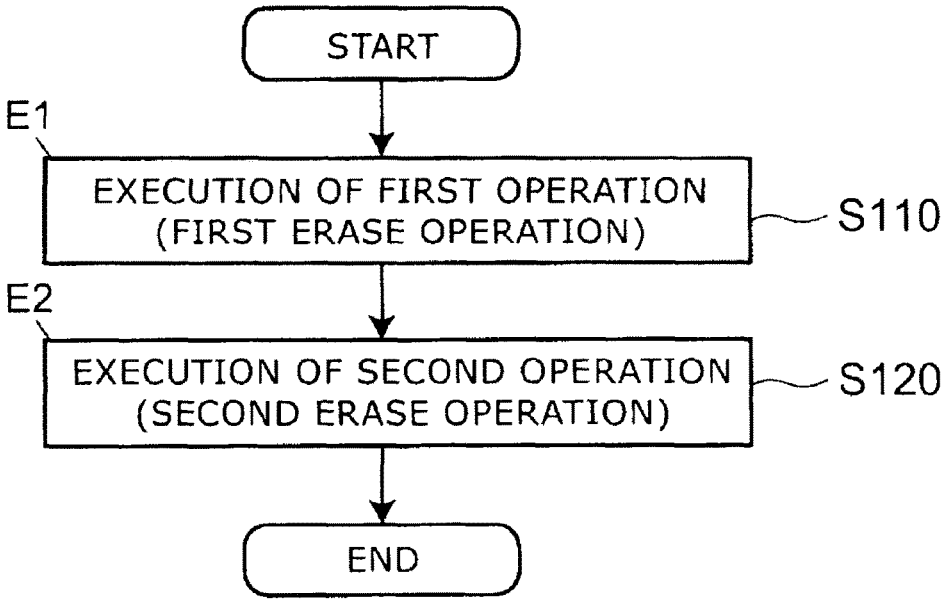
FIG. 1 is a flow chart illustrating the operation of a nonvolatile semiconductor memory device according to a first embodiment.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and the drawings, the same elements as those described previously with reference to earlier figures are labeled with like reference numerals, and the detailed description thereof is omitted as appropriate.

First Embodiment

FIG. 1 is a flow chart illustrating the operation of a nonvolatile semiconductor memory device according to a first embodiment.

Figure 2:
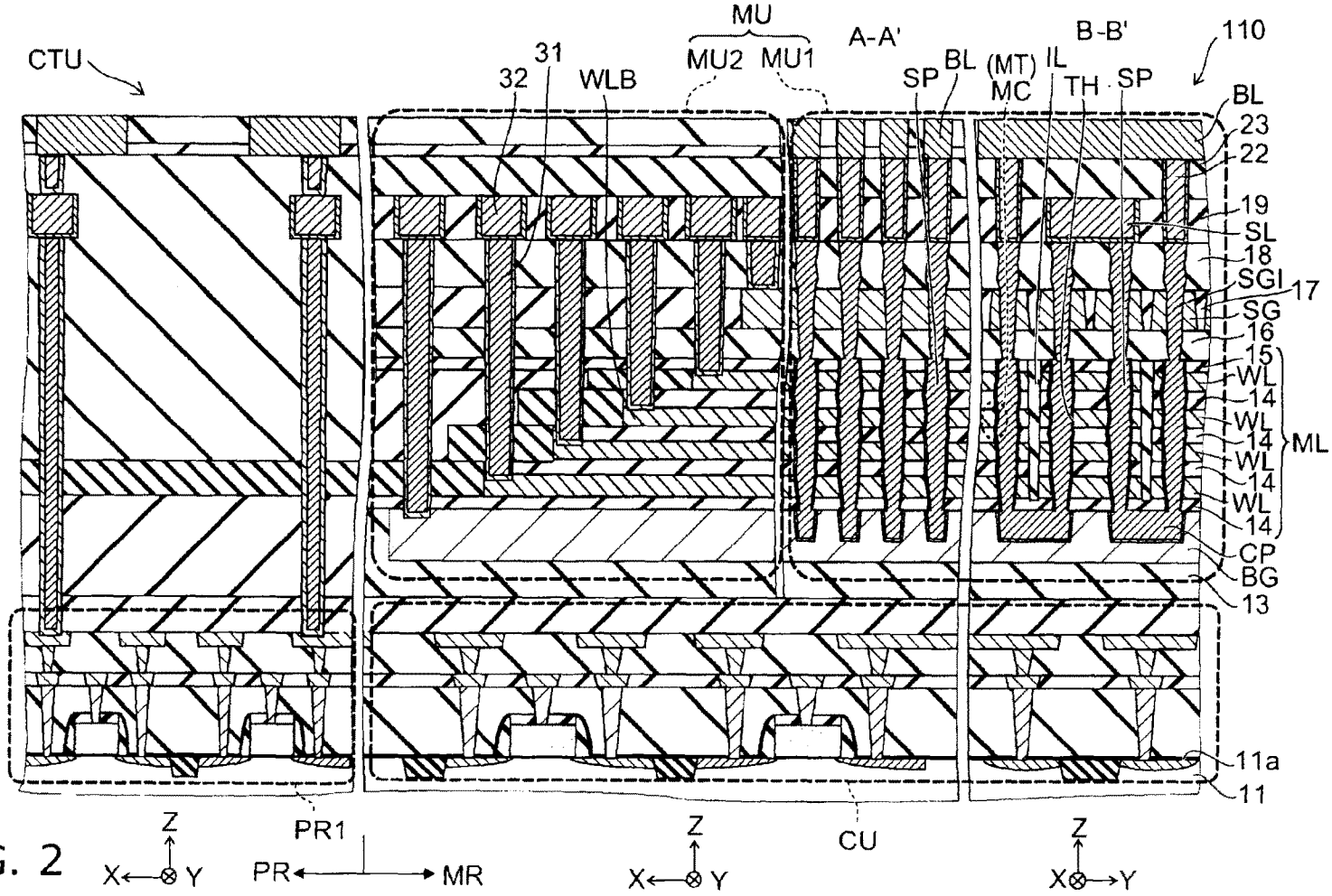
FIG. 2 is a schematic cross-sectional view illustrating the configuration of the nonvolatile semiconductor memory device according to the first embodiment.
Figure 3:
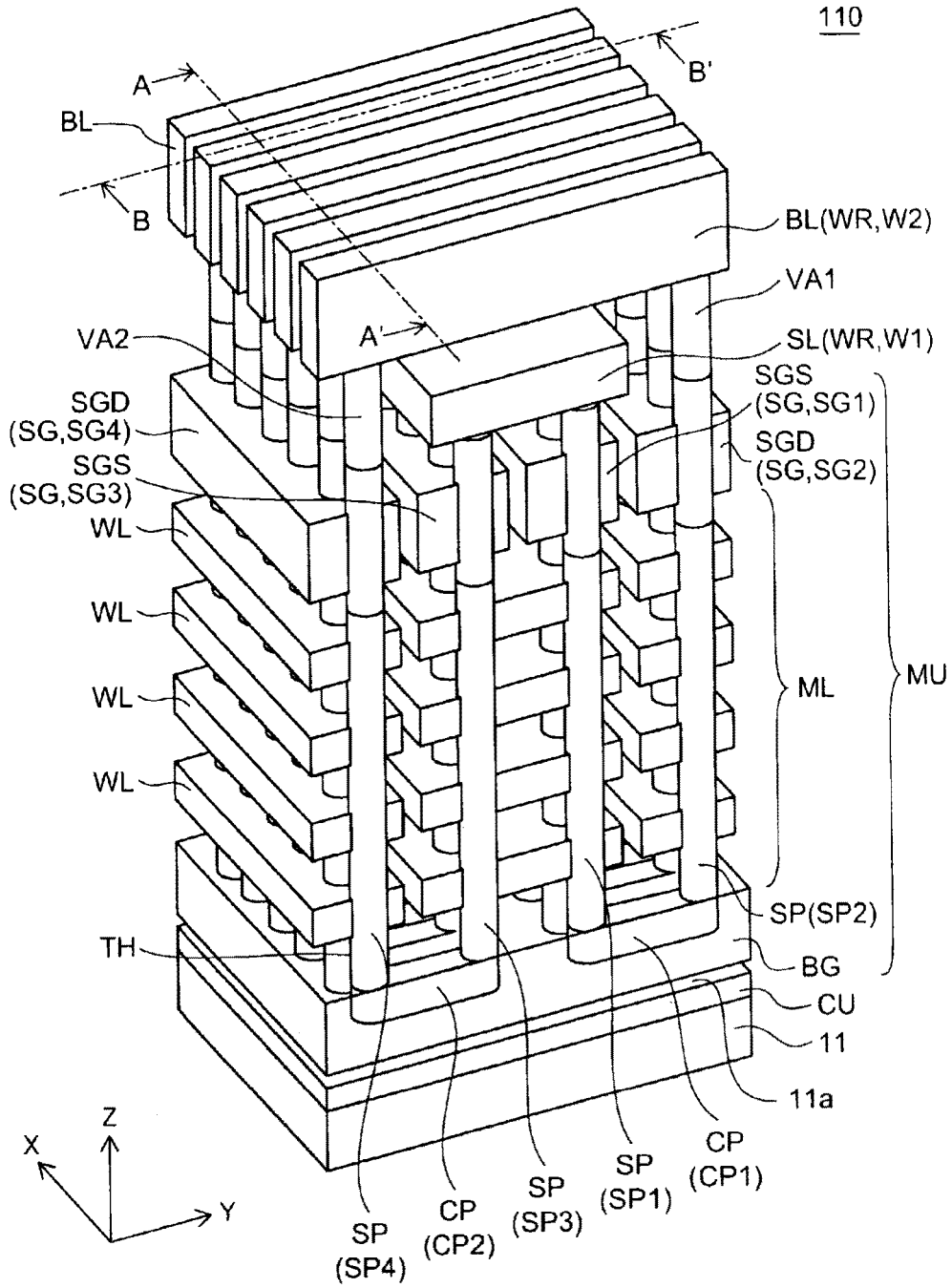
FIG. 3 is a schematic perspective view illustrating the configuration of the nonvolatile semiconductor memory device according to the first embodiment.
Figure 4:
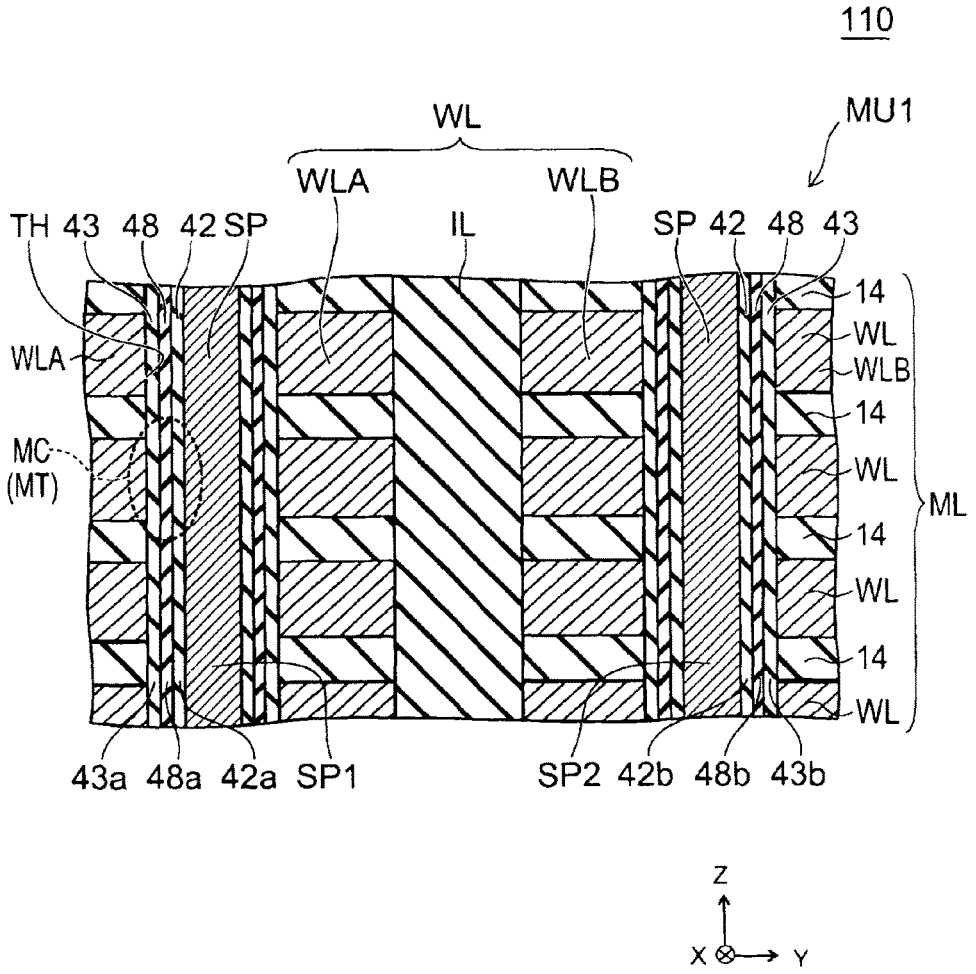
FIG. 4 is a schematic cross-sectional view illustrating the configuration of the nonvolatile semiconductor memory device according to the first embodiment.

FIGS. 2, 3, and 4 are a schematic cross-sectional view, a schematic perspective view, and a schematic cross-sectional view, respectively, illustrating the configuration of the nonvolatile semiconductor memory device according to the first embodiment.

It is noted that for clarity of illustration, FIG. 3 shows only the conductive portions and omits the insulating portions.

Figure 5:
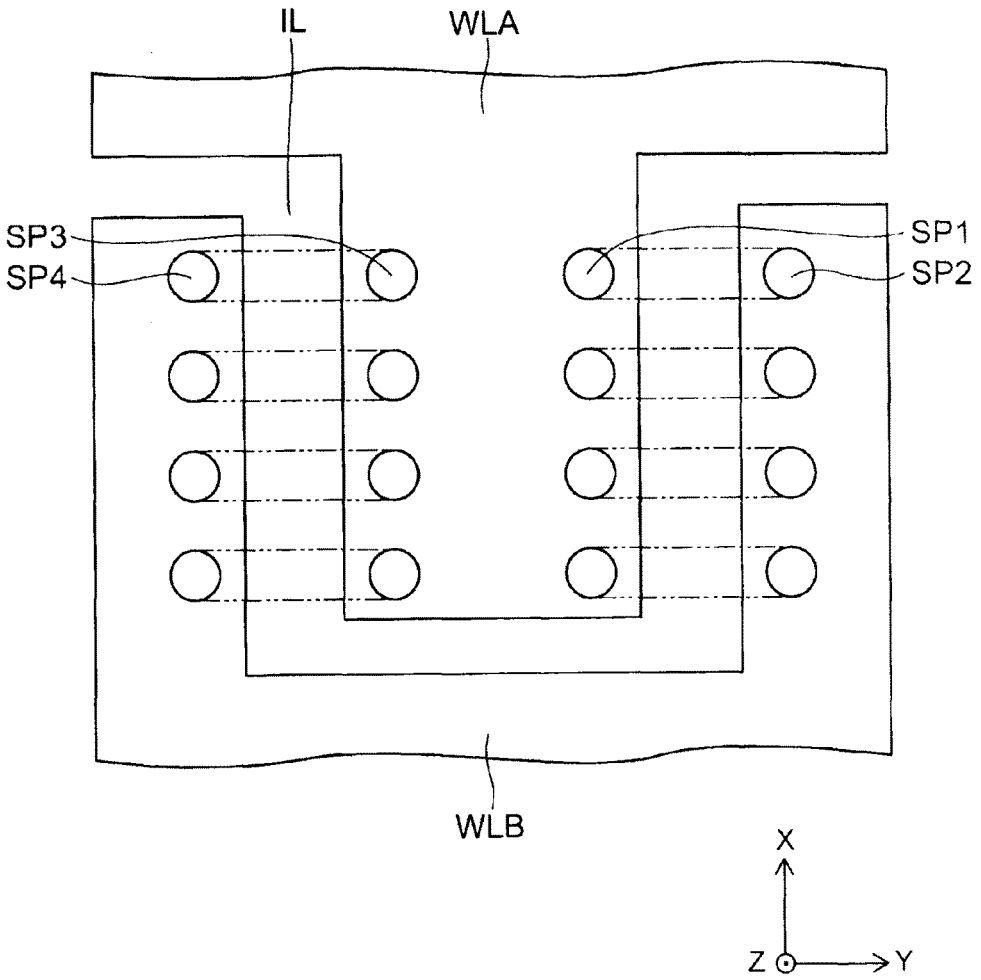
FIG. 5 is a schematic plan view illustrating the configuration of the electrode films of the nonvolatile semiconductor memory device according to the first embodiment.

FIG. 5 is a schematic plan view illustrating the configuration of the electrode films of the nonvolatile semiconductor memory device according to the first embodiment.

A nonvolatile semiconductor memory device 110 according to this embodiment is a collectively processed three-dimensional multilayer memory.

First, the configuration of the nonvolatile semiconductor memory device 110 is outlined with reference to FIGS. 2 to 5.

As shown in FIG. 2, the nonvolatile semiconductor memory device 110 includes a memory unit MU and a control unit CTU. The memory unit MU and the control unit CTU are provided on the major surface 11a of a substrate 11 illustratively made of single crystal silicon. However, the control unit CTU may be provided on a substrate different from the substrate on which the memory unit MU is provided. In the following description, it is assumed that the memory unit MU and the control unit CTU are provided on the same substrate (substrate 11).

On the substrate 11, for instance, a memory array region MR to be provided with memory cells and a peripheral region PR illustratively provided around the memory array region MR are defined. In the peripheral region PR, various peripheral region circuits PR1 are provided on the substrate 11.

In the memory array region MR, a circuit unit CU is illustratively provided on the substrate 11, and the memory unit MU is provided on the circuit unit CU. It is noted that the circuit unit CU is provided as needed and can be omitted. An interlayer insulating film 13 illustratively made of silicon oxide is provided between the circuit unit CU and the memory unit MU.

At least part of the control unit CTU, for instance, can illustratively be provided in at least one of the peripheral region circuit PR1 and the circuit unit CU described above.

The memory unit MU includes a matrix memory cell unit MU1 including a plurality of memory transistors MT and a wiring connecting unit MU2 for connecting wirings in the matrix memory cell unit MU1.

FIG. 3 illustrates the configuration of the matrix memory cell unit MU1.

With regard to the matrix memory cell unit MU1, FIG. 2 illustrates part of the A-A' cross section of FIG. 3 and part of the B-B' cross section of FIG. 3.

As shown in FIGS. 2 and 3, in the matrix memory cell unit MU1, a multilayer structure ML is provided on the major surface 11a of the substrate 11. The multilayer structure ML includes a plurality of electrode films WL and a plurality of interelectrode insulating films 14 alternately stacked in the direction perpendicular to the major surface 11a.

In this specification, for convenience of description, an XYZ orthogonal coordinate system is introduced. In this coordinate system, the direction perpendicular to the major surface 11a of the substrate 11 is referred to as a Z-axis direction (first direction). Furthermore, one of the directions in the plane parallel to the major surface 11a is referred to as a Y-axis direction (second direction). Furthermore, the direction perpendicular to the Z axis and the Y axis is referred to as a X-axis direction (third direction).

The stacking direction of the electrode films WL and the interelectrode insulating films 14 in the multilayer structure ML is the Z-axis direction. In other words, the electrode films WL and the interelectrode insulating films 14 are provided parallel to the major surface 11a.

FIG. 4 illustrates the configuration of the matrix memory cell unit MU1, illustratively corresponding to part of the B-B' cross section of FIG. 3.

As shown in FIGS. 3 and 4, the memory unit MU of the nonvolatile semiconductor memory device 110 includes the aforementioned multilayer structure ML, a semiconductor pillar SP (first semiconductor pillar SP1) piercing the multilayer structure ML in the Z-axis direction, a memory layer 48 (first memory layer 48a), an inner insulating film 42 (first inner insulating film 42a), an outer insulating film 43 (first outer insulating film 43a), and a wiring WR (first wiring W1).

The memory layer 48 is provided between each of the electrode films WL and the semiconductor pillar SP. The inner insulating film 42 is provided between the memory layer 48 and the semiconductor pillar SP. The outer insulating film 43 is provided between each of the electrode films WL and the memory layer 48. The wiring WR is electrically connected to one end (first end) of the semiconductor pillar SP.

For instance, the outer insulating film 43, the memory layer 48, and the inner insulating film 42 are formed in this order on the inner wall surface of the through hole TH piercing the multilayer structure ML in the Z-axis direction, and the remaining space is filled with a semiconductor to form the semiconductor pillar SP.

A memory cell MC is provided at the intersection between the electrode film WL of the multilayer structure ML and the semiconductor pillar SP. That is, memory transistors MT including the memory layer 48 are provided in a three-dimensional matrix at the intersection between the electrode film WL and the semiconductor pillar SP. Each of the memory transistors MT functions as a memory cell MC for storing data by storing charge in the memory layer 48.

The inner insulating film 42 functions as a tunnel insulating film in the memory transistor MT of the memory cell MC. On the other hand, the outer insulating film 43 functions as a block insulating film in the memory transistor MT of the memory cell MC. The interelectrode insulating film 14 functions as an interlayer insulating film for insulating the electrode films WL from each other.

The electrode film WL can be made of any conductive material, such as amorphous silicon or polysilicon provided with conductivity by impurity doping, or can be made of metals and alloys. A prescribed electrical signal is applied to the electrode film WL, which functions as a word line of the nonvolatile semiconductor memory device 110.

The interelectrode insulating film 14, the inner insulating film 42, and the outer insulating film 43 can illustratively be silicon oxide films. It is noted that the interelectrode insulating film 14, the inner insulating film 42, and the outer insulating film 43 may be a monolayer film or a multilayer film.

The memory layer 48 can illustratively be a silicon nitride film and functions as a portion for storing information by storing or releasing charge by an electric field applied between the semiconductor pillar SP and the electrode film WL. The memory layer 48 may be a monolayer film or a multilayer film.

As described later, the interelectrode insulating film 14, the inner insulating film 42, the memory layer 48, and the outer insulating film 43 can be made of various materials, not limited to the materials illustrated above.

Although FIGS. 2 and 3 illustrate the case where the multilayer structure ML includes four electrode films WL, the number of electrode films WL provided in the multilayer structure ML is arbitrary. In the following description, it is assumed that the number of electrode films WL is four.

In this example, two semiconductor pillars SP are connected by a connecting portion CP. More specifically, the memory unit MU further includes a second semiconductor pillar SP2 (one of a plurality of semiconductor pillars SP), a second memory layer 48b, a second inner insulating film 42b, a second outer insulating film 43b, a second wiring W2, a first connecting portion CP1 (one of a plurality of connecting portions CP), a first select gate SG1 (one of a plurality of select gates SG, such as source side select gate SGS), and a second select gate SG2 (one of the plurality of select gates SG, such as drain side select gate SGD).

The second semiconductor pillar SP2 is adjacent to the first semiconductor pillar SP1 (one of the plurality of semiconductor pillars SP) illustratively in the Y-axis direction and pierces the multilayer structure ML in the Z-axis direction.

The second memory layer 48b is provided between each of the electrode films WL and the second semiconductor pillar SP2. The second inner insulating film 42b is provided between the second memory layer 48b and the second semiconductor pillar SP2. The second outer insulating film 43b is provided between each of the electrode films WL and the second memory layer 48b.

The second wiring WR2 is electrically connected to one end (second end) of the second semiconductor pillar SP2.

The first connecting portion CP1 electrically connects the other end (third end) opposite to the one end (first end) of the first semiconductor pillar SP1 and the other end (fourth end) opposite to the one end (second end) of the second semiconductor pillar SP2.

Specifically, the third end is the end of the first semiconductor pillar SP1 on the substrate 11 side, and the fourth end is the end of the second semiconductor pillar SP2 on the substrate 11 side. The first connecting portion CP1 connects the first semiconductor pillar SP1 and the second semiconductor pillar SP2 to each other on the substrate 11 side. The first connecting portion CP1 aligns in the Y-axis direction. The first connecting portion CP1 is made of the same material as the first and second semiconductor pillars SP1 and SP2.

More specifically, a back gate BG (connecting conductive layer) is provided on the major surface 11a of the substrate 11 via the interlayer insulating film 13. A trench is provided in portions of the back gate BG opposed to the first and second semiconductor pillars SP1 and SP2. An outer insulating film 43, a memory layer 48, and an inner insulating film 42 are formed inside the trench, and the remaining space is filled with a connecting portion CP made of a semiconductor. It is noted that the formation of the outer insulating film 43, the memory layer 48, the inner insulating film 42, and the connecting portion CP in the trench is performed simultaneously and collectively with the formation of the outer insulating film 43, the memory layer 48, the inner insulating film 42, and the semiconductor pillar SP. Thus, the back gate BG is provided opposite to the connecting portion CP.

Thus, the first and second semiconductor pillars SP1 and SP2 and the connecting portion CP constitute a U-shaped memory string. This memory string is illustratively a NAND memory string.

However, the invention is not limited thereto. As described later, each semiconductor pillar SP may be independent and not be connected by the connecting portion CP on the substrate 11 side. In the following description, it is assumed that two semiconductor pillars SP are connected by the connecting portion CP.

As shown in FIGS. 2 and 3, one end (first end) of the first semiconductor pillar SP1 opposite to the first connecting portion CP1 is connected to a source line SL (first wiring W1), and one end (second end) of the second semiconductor pillar SP2 opposite to the first connecting portion CP1 is connected to a bit line BL (second wiring W2). Here, the semiconductor pillar SP is connected to the bit line BL by a via VA1 and a via VA2.

In this example, the bit line BL aligns in the Y-axis direction, and the source line SL aligns in the X-axis direction.

The first select gate SG1 (e.g., source side select gate SGS) is provided between the first end of the first semiconductor pillar SP1 and the multilayer structure ML and pierced by the first semiconductor pillar SP1.

The second select gate SG2 (e.g., drain side select gate SGD) is provided between the second end of the second semiconductor pillar SP2 and the multilayer structure ML and pierced by the second semiconductor pillar SP2.

Thus, desired data can be written to and read from an arbitrary memory cell MC of an arbitrary semiconductor pillar SP.

The select gate SG can be made of any conductive material, such as polysilicon or amorphous silicon. In this example, the select gate SG is divided in the Y-axis direction and shaped like strips aligning in the X-axis direction.

As shown in FIG. 2, an interlayer insulating film 15 is provided at the top (on the side farthest from the substrate 11) of the multilayer structure ML. Furthermore, an interlayer insulating film 16 is provided on the multilayer structure ML, a select gate SG is provided thereon, and an interlayer insulating film 17 is provided between the select gates SG. A through hole TH is provided in the select gate SG, a select gate insulating film SGI of a select gate transistor is provided on the inner side surface thereof, and a semiconductor is filled inside it. This semiconductor is connected to the semiconductor pillar SP.

That is, the memory unit MU includes a select gate SG stacked on the multilayer structure ML in the Z-axis direction and pierced by the semiconductor pillar SP on the wiring WR (at least one of the source line SL and the bit line BL) side.

Furthermore, an interlayer insulating film 18 is provided on the interlayer insulating film 17, and a source line SL and vias 22 (vias VA1 and VA2) are provided thereon, and an interlayer insulating film 19 is provided around the source line SL. Furthermore, an interlayer insulating film 23 is provided on the source line SL, and a bit line BL is provided thereon.

The interlayer insulating films 15, 16, 17, 18, 19, and 23, and the select gate insulating film SGI can illustratively be made of silicon oxide.

With regard to the plurality of semiconductor pillars provided in the nonvolatile semiconductor memory device 110, when all or any of the semiconductor pillars are referred to, the wording "semiconductor pillar SP" is used. On the other hand, when a particular semiconductor pillar is referred to in describing the relationship between the semiconductor pillars, for instance, the wording "n-th semiconductor pillar SPn" (n is any integer of one or more) is used.

As shown in FIG. 5, among the electrode films WL, the electrode films corresponding to the semiconductor pillars SP(4m+1) and SP(4m+3) with the aforementioned integer n being equal to 4m+1 and 4m+3 are commonly connected into an electrode film WLA, and the electrode films corresponding to the semiconductor pillars SP(4m+2) and SP(4m+4) with n being equal to 4m+2 and 4m+4 are commonly connected into an electrode film WLB, where m is an integer of zero or more. That is, the electrode films WL are shaped into the electrode film WLA and the electrode film WLB, which are opposed in the X-axis direction and meshed with each other like comb teeth.

As shown in FIGS. 4 and 5, the electrode film WL is divided by an insulating layer IL into a first region (electrode film WLA) and a second region (electrode film WLB).

Furthermore, as in the wiring connecting unit MU2 illustrated in FIG. 2, at one end in the X-axis direction, the electrode film WLB is connected to a word line 32 by a via plug 31 and electrically connected to, for instance, a driving circuit provided in the substrate 11. Likewise, at the other end in the X-axis direction, the electrode film WLA is connected to the word line by the via plug and electrically connected to the driving circuit. In other words, the length in the X-axis direction of the electrode films WL (electrode film WLA and electrode film WLB) stacked in the Z-axis direction is varied stepwise, so that electrical connection to the driving circuit is implemented by the electrode film WLA at one end in the X-axis direction and by the electrode film WLB at the other end in the X-axis direction.

As shown in FIG. 3, the memory unit MU can further include a third semiconductor pillar SP3 (one of the plurality of semiconductor pillars SP), a fourth semiconductor pillar SP4 (one of the plurality of semiconductor pillars SP), and a second connecting portion CP2 (one of the plurality of connecting portions CP).

The third semiconductor pillar SP3 is adjacent to the first semiconductor pillar SP1 on the opposite side of the first semiconductor pillar SP1 from the second semiconductor pillar SP2 in the Y-axis direction and pierces the multilayer structure ML in the Z-axis direction. The fourth semiconductor pillar SP4 is adjacent to the third semiconductor pillar SP3 on the opposite side of the third semiconductor pillar SP3 from the first semiconductor pillar SP1 in the Y-axis direction and pierces the multilayer structure ML in the Z-axis direction.

The second connecting portion CP2 electrically connects the third semiconductor pillar SP3 and the fourth semiconductor pillar SP4 on the same side (the same side as the first connecting portion CP1) in the Z-axis direction. The second connecting portion CP2 aligns in the Y-axis direction and is opposed to the back gate BG.

The memory layer 48 is provided also between each of the electrode films WL and the third and fourth semiconductor pillars SP3 and SP4 and between the back gate BG and the second connecting portion CP2. The inner insulating film 42 is provided also between the third and fourth semiconductor pillars SP3 and SP4 and the memory layer 48 and between the memory layer 48 and the second connecting portion CP2. The outer insulating film 43 is provided also between each of the electrode films WL and the memory layer 48 and between the memory layer 48 and the back gate BG.

The source line SL is connected to the end of the third semiconductor pillar SP3 opposite to the second connecting portion CP2. The bit line BL is connected to the end of the fourth semiconductor pillar SP4 opposite to the second connecting portion CP2.

Furthermore, a third select gate SG3 (one of the plurality of select gates SG, such as source side select gate SGS) is provided opposite to the third semiconductor pillar SP3, and a fourth select gate SG4 (one of the plurality of select gates SG, such as drain side select gate SGD) is provided opposite to the fourth semiconductor pillar SP4.

As shown in FIG. 1, in the nonvolatile semiconductor memory device 110 thus configured, when performing an erase operation, the control unit CTU performs operations including execution of a first operation E1 (step S110) and execution of a second operation E2 (step S120) described below.

The first operation E1 (first erase operation) is performed during a first period. In the first operation E1, the control unit CTU sets the first wiring W1 at a first potential V01 and the electrode film WL at a second potential V02 lower than the first potential V01.

The second operation E2 (second erase operation) is performed during a second period after the first operation E1. In the second operation E2, the control unit CTU sets the first wiring W1 at a third potential V03 and the electrode film WL at a fourth potential V04 lower than the third potential V03.

Furthermore, at least one of the following is satisfied: the length of the second period being shorter than the length of the first period; and the difference between the third potential V03 and the fourth potential V04 being lower than the difference between the first potential V01 and the second potential V02.

The erase operation is the operation of performing at least one of injection of holes into the memory layer 48 (first memory layer 48a and second memory layer 48b) and extraction of electrons from the memory layer 48 (first memory layer 48a and second memory layer 48b). The memory transistor MT serving as a memory cell MC has a state (erase state) of low threshold voltage and a state (write state) having a relatively higher threshold voltage than the state of low threshold voltage. The erase operation is an operation for setting the threshold voltage of the memory transistor MT to the lower state.

The write operation is the operation of performing at least one of injection of electrons into the memory layer 48 and extraction of holes from the memory layer 48. That is, the write operation is an operation for setting the threshold voltage of the memory transistor MT to the higher state.

In the first operation E1, because the second potential V02 is lower than the first potential V01, the electrode film WL is set at a potential of negative polarity with reference to the first wiring W1. This results in performing at least one of injection of holes into the memory layer 48 and extraction of electrons from the memory layer 48.

The first operation E1 is the erase operation. The first operation E1 produces a state (shallow state) having a voltage slightly higher than the target threshold voltage. That is, the first operation E1 is "soft erasure".

In the second operation E2 as well, because the fourth potential V04 is lower than the third potential V03, the electrode film WL is set at a potential of negative polarity with reference to the first wiring W1. This results in performing at least one of injection of holes into the memory layer 48 and extraction of electrons from the memory layer 48.

The second operation E2 is also the erase operation. The threshold voltage, which has been set slightly higher than the target threshold voltage in the first operation E1, is set to the target value by this second operation E2. That is, the second operation E2 is "additional erasure".

For instance, the length of the second period of the second operation E2 is set shorter than the length of the first period of the first operation E1. In other words, the pulse width of the erase voltage applied in the second operation E2 is set shorter than the pulse width of the erase voltage applied in the first operation E1. Alternatively, the difference between the third potential V03 and the fourth potential V04 is set smaller than the difference between the first potential V01 and the second potential V02.

That is, the second operation E2 (additional erasure) is an operation with at least one of shorter pulse width and lower erase voltage than in the first operation E1 (soft erasure).

Thus, in the erase operation, a stable erase state can be realized by combining the erase operation of "soft erasure" (first operation E1) for setting the threshold voltage to a value higher (shallower) than the target value and the operation of "additional erasure" (second operation E2) for subsequently setting the threshold voltage to the target value.

In the following, for simplicity of description, a description is first given of an example in which the length of the second period of the second operation E2 is equal to the length of the first period of the first operation E1 and the difference between the third potential V03 and the fourth potential V04 is smaller than the difference between the first potential V01 and the second potential V02.

Figure 6A:
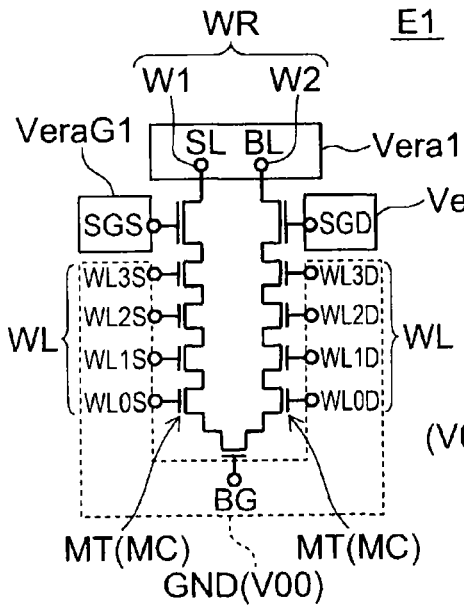
FIGS. 6A to 6D are schematic diagrams illustrating the operation of the nonvolatile semiconductor memory device according to the first embodiment.
Figure 6B:
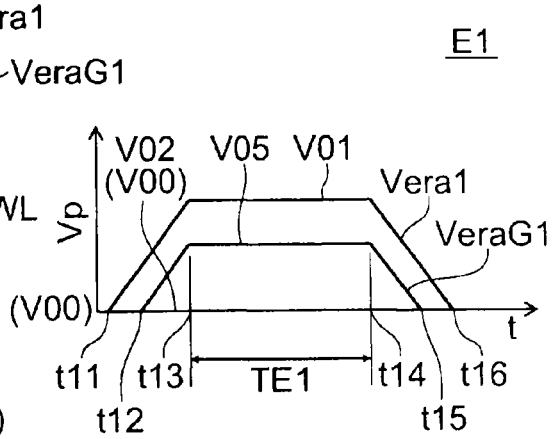
Figure 6C:
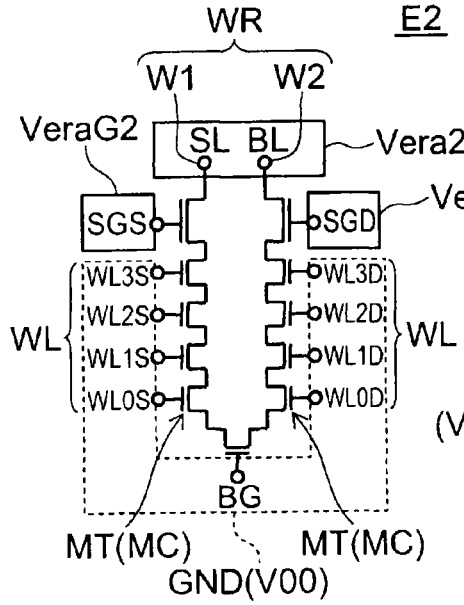
Figure 6D:
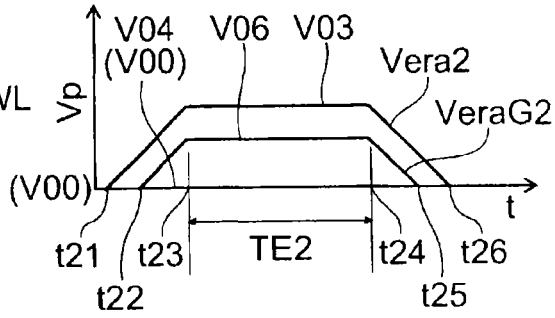

FIGS. 6A to 6D are schematic diagrams illustrating the operation of the nonvolatile semiconductor memory device according to the first embodiment. More specifically, FIGS. 6A and 6B are a schematic diagram and a graph, respectively, illustrating the state of potential in the first operation E1. FIGS. 6C and 6D are a schematic diagram and a graph, respectively, illustrating the state of potential in the second operation E2. In FIGS. 6B and 6D, the horizontal axis represents time t, and the vertical axis represents potential Vp.

Figures 7A, 7B, 7C:
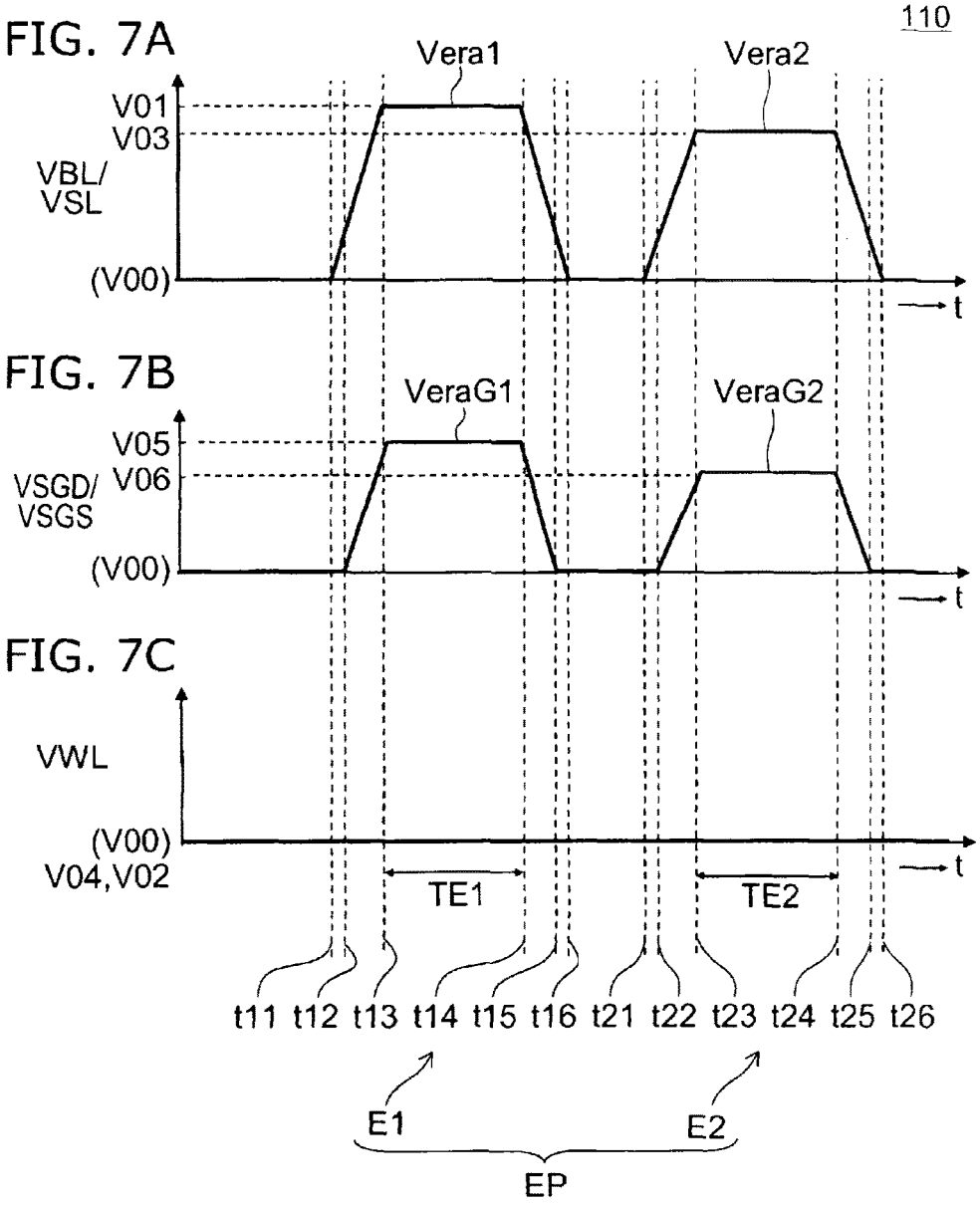
FIGS. 7A to 7C are schematic diagrams illustrating the operation of the nonvolatile semiconductor memory device according to the first embodiment.

FIGS. 7A to 7C are schematic diagrams illustrating the operation of the nonvolatile semiconductor memory device according to the first embodiment. More specifically, FIGS. 7A, 7B, and 7C show, in the first operation E1 and the second operation E2, the potential of the first wiring W1 (the potential VSL of the source line SL) and the potential of the second wiring W2 (the potential VBL of the bit line BL); the potential VSGD of the drain side select gate SGD and the potential VSGS of the source side select gate SGS; and the potential VWL of the electrode film WL, respectively.

Figure 8A:
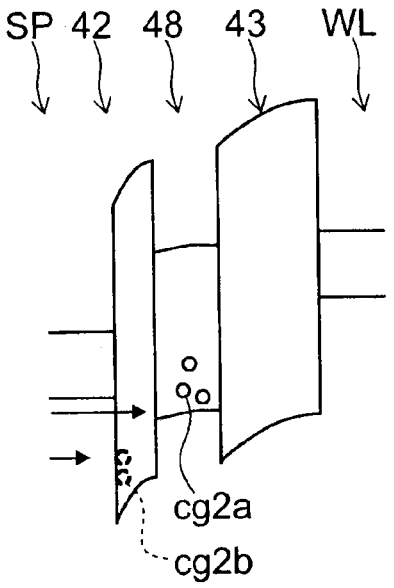
FIGS. 8A to 8C are schematic diagrams illustrating the operation of the nonvolatile semiconductor memory device according to the first embodiment.
Figure 8B:
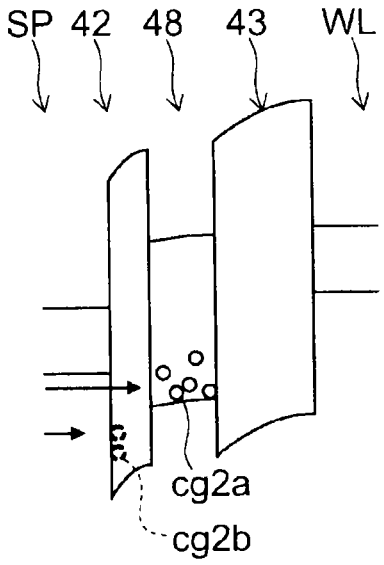
Figure 8C:
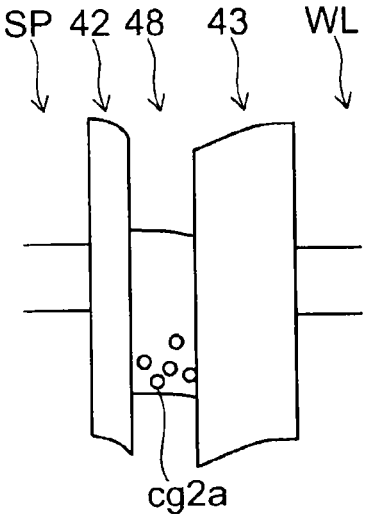

FIGS. 8A to 8C are schematic diagrams illustrating the operation of the nonvolatile semiconductor memory device according to the first embodiment. More specifically, FIGS. 8A, 8B, and 8C are energy band diagrams in the first operation E1, in the second operation E2, and after the second operation E2, respectively.

As shown in FIGS. 6A and 6B, the control unit CTU sets the wiring WR (e.g., first wiring W1 and second wiring W2) at a first potential V01 and the electrode film WL at a second potential V02 lower than the first potential V01. In the following, it is assumed that the second potential V02 is the reference potential V00.

The reference potential V00 can be set to an arbitrary potential. In the following, it is assumed that the reference potential V00 is the ground potential GND.

For instance, as shown in FIGS. 7A to 7C, in the first operation E1, the first erase voltage Vera1 applied to the wiring WR rises from the reference potential V00 at time t11, reaches the first potential V01 at time t13, then keeps the first potential V01 until time t14, starts falling at time t14, and returns to the reference potential V00 at time t16. In this example, the period from time t13 to time t14 is the first period TE1.

The first erase-time select gate voltage VeraG1 applied to the source side select gate SGS and the drain side select gate SGD rises from the reference potential V00 at time t12, reaches a fifth potential V05 at time t13, then keeps the fifth potential V05 until time t14, starts falling at time t14, and returns to the reference potential V00 at time t15.

In this example, the time when the first erase-time select gate voltage VeraG1 reaches the fifth potential V05 and the time when it starts falling from the fifth potential V05 are respectively the same as the time t13 when the first erase voltage Vera1 reaches the first potential V01 and the time t14 when it starts falling from the first potential V01. However, the time of reaching the fifth potential V05 and the time of starting falling from the fifth potential V05 may be different from the time t13 of reaching the first potential V01 and the time t14 of starting falling from the first potential V01.

In the first operation E1, the potential of the electrode film WL and the back gate BG is constant at the second potential V02 (reference potential V00).

The first potential V01 is illustratively 20 V (volts), the fifth potential V05 is illustratively 15 V, and the second potential V02 (reference potential V00) is illustratively 0 V. Thus, the fifth potential V05 is lower than the first potential V01, and the difference between the first potential V01 and the fifth potential V05 is illustratively about 5 V. It is noted that the maximum of the first erase-time select gate voltage VeraG1 (i.e., the difference between the fifth potential V05 and the reference potential V00) is lower than the breakdown voltage of the select gate transistor of the select gate SG.

Time t12 comes after time t11, time t13 comes after time t12, time t14 comes after time t13, time t15 comes after time t14, and time t16 comes after time t15.

The first erase voltage Vera1 is not less than the first erase-time select gate voltage VeraG1 at any time. More specifically, during the first period TE1, after the time (time t11) when the potential of the first wiring W1 starts changing from the second potential V02 to the first potential V01, the potential of the select gate (source side select gate SGS and drain side select gate SGD) starts changing from the second potential V02 to the fifth potential V05 (time t12). During the second period TE2, after the time (time t16) when the potential of the first wiring W1 finishes changing from the first potential V01 to the second potential V02, the potential of the select gate finishes changing from the fifth potential V05 to the second potential V02 (time t15).

By applying this first erase-time select gate voltage VeraG1 to the drain side select gate SGD and the source side select gate SGS, GIDL (gate-induced drain leakage) can be generated in the semiconductor pillar SP near the portion opposed to the drain side select gate SGD and the source side select gate SGS without gate breakdown of the select gate transistor.

By applying the first erase voltage Vera1 to the first wiring W1 and the second wiring W2, holes are injected into the memory layer 48 (first memory layer 48a and second memory layer 48b) of the memory transistor MT formed at the intersection between the electrode film WL and the semiconductor pillar SP. Here, the first erase voltage Vera1 is set to a voltage such that the threshold voltage of the memory transistor MT is slightly higher than the target value of the erase state. For instance, when the target threshold voltage is −2 V, the threshold voltage of the memory transistor MT is set to approximately −1 V. That is, soft erasure is performed.

In the erase operation, the operation based on GIDL as described above is specific to the collectively processed three-dimensional multilayer memory, unlike the operation in the three-dimensional multilayer memory with planar memory cells simply stacked therein. Furthermore, in order to generate GIDL, the aforementioned potential (first erase voltage Vera1) of the wiring WR (first wiring W1 and second wiring W2) and the aforementioned potential (first erase-time select gate voltage VeraG1) of the select gate SG (first select gate SG1 and second select gate SG2) are specific to the collectively processed three-dimensional multilayer memory, unlike those in the three-dimensional multilayer memory with planar memory cells simply stacked therein. Thus, the control unit CTU of the nonvolatile semiconductor memory device 110 according to this embodiment performs operations specific to the collectively processed three-dimensional multilayer memory.

Thus, as shown in FIG. 8A, holes are injected from the semiconductor pillar SP side toward the electrode film WL, and holes cg2a are captured in the memory layer 48.

Here, the first erase voltage Vera1 is set to make the threshold voltage of the memory transistor MT shallower (higher) than the target threshold voltage. This suppresses holes cg2b from being captured by traps at shallow energy levels at the interface between the semiconductor pillar SP and the inner insulating film 42 and in the portion of the inner insulating film 42 on the semiconductor pillar SP side.

Subsequently, as shown in FIGS. 6C and 6D, in the second operation E2, the control unit CTU sets the wiring WR (e.g., first wiring W1 and second wiring W2) at a third potential V03 and the electrode film WL at a fourth potential V04 lower than the third potential V03. Here, the fourth potential V04 is arbitrary. However, in the following, it is assumed that the fourth potential V04 is equal to the second potential V02 (i.e., in this example, the reference potential V00).

Because the difference between the third potential V03 and the fourth potential V04 is smaller than the difference between the first potential V01 and the second potential V02, the third potential V03 is lower than the first potential V01. The third potential V03 is illustratively 18 V.

For instance, as shown in FIGS. 7A to 7C, in the second operation E2, the second erase voltage Vera2 applied to the wiring WR rises from the reference potential V00 at time t21, reaches the third potential V03 at time t23, then keeps the third potential V03 until time t24, starts falling at time t24, and returns to the reference potential V00 at time t26. In this example, the period from time t23 to time t24 is the second period TE2. The length of the second period TE2 is equal to the length of the first period TE1.

The second erase-time select gate voltage VeraG2 applied to the source side select gate SGS and the drain side select gate SGD rises from the reference potential V00 at time t22, reaches a sixth potential V06 at time t23, then keeps the sixth potential V06 until time t24, starts falling at time t24, and returns to the reference potential V00 at time t25. Again, the time of reaching the sixth potential V06 and the time of starting falling from the sixth potential V06 may be different from the time t23 of reaching the third potential V03 and the time t24 of starting falling from the third potential V03, respectively.

In the second operation E2, the potential of the electrode film WL and the back gate BG is constant at the fourth potential V04, which is equal to the second potential V02 or the reference potential V00.

If the third potential V03 is illustratively 18 V, the sixth potential V06 is illustratively 13 V. The sixth potential V06 only needs to be lower than the third potential V03 and higher than the fourth potential V04 (in this example, the second potential V02, or the reference potential V00) and may be equal to the fifth potential V05.

The sixth potential V06 is lower than the third potential V03. In this example, the difference between the third potential V03 and the sixth potential V06 is approximately 5 V. Again, the maximum of the second erase-time select gate voltage VeraG2 (i.e., the difference between the sixth potential V06 and the reference potential V00) is lower than the breakdown voltage of the select gate transistor of the select gate SG.

Time t22 comes after time t21, time t23 comes after time t22, time t24 comes after time t23, time t25 comes after time t24, and time t26 comes after time t25.

The second erase voltage Vera2 is not less than the second erase-time select gate voltage VeraG2 at any time.

By applying this second erase-time select gate voltage VeraG2 to the drain side select gate SGD and the source side select gate SGS, GIDL is generated in the semiconductor pillar SP near the portion opposed to the drain side select gate SGD and the source side select gate SGS without gate breakdown of the select gate transistor.

By applying the second erase voltage Vera2 to the first wiring W1 and the second wiring W2, holes are injected into the memory layer 48 (first memory layer 48a and second memory layer 48b) of the memory transistor MT.

Here, the second erase voltage Vera2 is set lower than the first erase voltage Vera1. Thus, the threshold voltage, which has been set slightly higher by application of the first erase voltage Vera1, is slightly lowered and set to the target value. Consequently, the threshold voltage of the memory transistor MT is set to the target value, such as −2 V.

More specifically, as shown in FIG. 8B, holes are injected from the semiconductor pillar SP side toward the electrode film WL, and holes cg2a are captured in the memory layer 48 in addition to the holes cg2a captured in the first operation E1.

Here, the second erase voltage Vera2 applied is a low voltage. This also suppresses holes cg2b from being captured by traps at shallow energy levels at the interface between the semiconductor pillar SP and the inner insulating film 42 and in the portion of the inner insulating film 42 on the semiconductor pillar SP side.

Thus, as shown in FIG. 8C, holes cg2b are suppressed from being captured by traps at shallow energy levels at the interface between the semiconductor pillar SP and the inner insulating film 42 and in the portion of the inner insulating film 42 on the semiconductor pillar SP side. This results in the desired erase state in which holes cg2a are captured in the memory layer 48.

By this second operation E2, the threshold voltage of the memory transistor MT falls approximately 1 V from after the first operation E1 and results in reaching the target value (e.g., −2 V).

Thus, in the nonvolatile semiconductor memory device 110 according to this embodiment, the erase operation EP includes a combination of the first operation E1 for soft erasure and the second operation E2 for additional erasure. Hence, the erase state can be made uniform. In other words, an excessively deep erase state (the state with an excessively low threshold voltage) can be suppressed. Thus, the state before writing can be made uniform, which facilitates writing and can improve controllability in the write operation.

For instance, in a comparative example in which the erase operation EP is performed only by a single operation (e.g., first operation E1), the erase voltage needs to be excessively increased in order to form the erase state irrespective of the characteristics variation among a plurality of memory transistors MT. An excessively high erase voltage causes excessively deep erasure, and some memory transistors MT may fall outside the desired threshold voltage. Furthermore, under an excessively high erase voltage, holes cg2b may be captured by traps at shallow energy levels at the interface between the semiconductor pillar SP and the inner insulating film 42 and in the portion of the inner insulating film 42 on the semiconductor pillar SP side and may degrade retention characteristics. Furthermore, erroneous write may occur due to the so-called back tunneling by which electrons are injected into the memory layer 48 (first memory layer 48a and second memory layer 48b) via the outer insulating film 43 (first outer insulating film 43a and second outer insulating film 43b), for instance. Furthermore, an excessive stress is applied to the memory transistor MT, and it may cause reliability degradation.

In contrast, according to this embodiment, the erase operation EP includes a combination of the first operation E1 for soft erasure and the second operation E2 for additional erasure. Hence, the excessively deep erasure does not occur, and the threshold voltage can be made uniform. This facilitates write operation. Furthermore, holes cg2b are suppressed from being captured by traps at shallow energy levels, which improves retention characteristics and stabilizes the erase state. Furthermore, the back tunneling is suppressed, and erroneous write is suppressed. Furthermore, stress on the memory transistor MT is reduced, thereby improving reliability.

As described above, the memory unit MU further includes a select gate SG stacked on the multilayer structure ML in the first direction (Z-axis direction) and pierced by one end of the semiconductor pillar SP. The control unit CTU sets, during the first period TE1 of the first operation E1, the select gate SG at the fifth potential V05, which is lower than the first potential V01 and higher than the second potential V02, and sets, during the second period TE2 of the second operation E2, the select gate SG at the sixth potential V06, which is lower than the third potential V03 and higher than the fourth potential V04. Thus, GIDL is generated to perform the erase operation EP.

In the following, a description is given of an example in which the length of the second period TE2 of the second operation E2 is shorter than the length of the first period TE1 of the first operation E1 and the difference between the third potential V03 and the fourth potential V04 is equal to the difference between the first potential V01 and the second potential V02. A nonvolatile semiconductor memory device 111 in which this operation is performed is the same in configuration as the nonvolatile semiconductor memory device 110, but different in the operation of the control unit CTU.

FIGS. 9A to 9D are schematic diagrams illustrating the operation of an alternative nonvolatile semiconductor memory device according to the first embodiment.

Figures 9A, 9B:
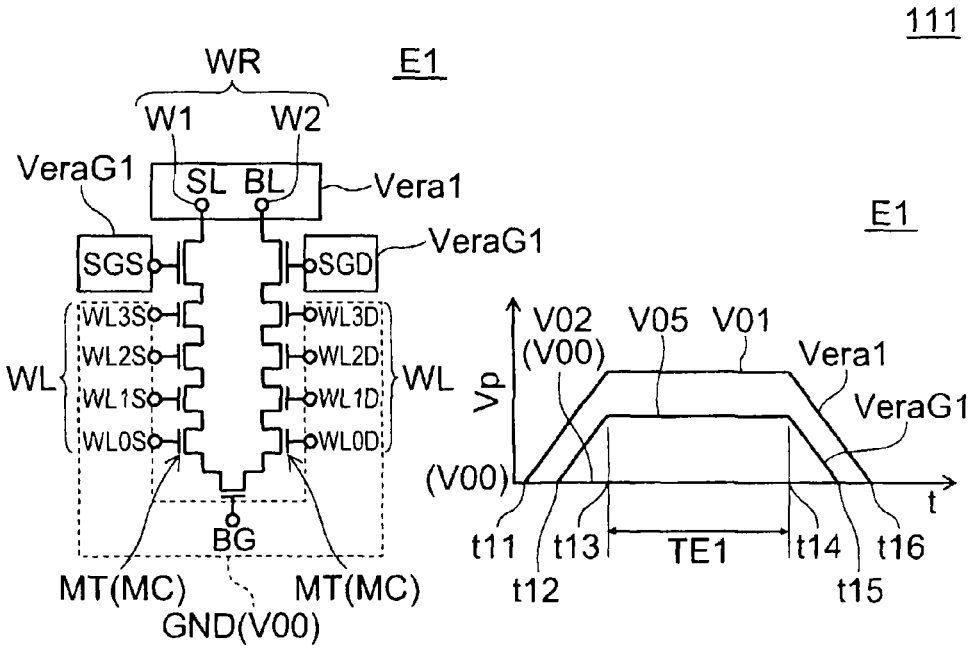
FIGS. 9A to 9D are schematic diagrams illustrating the operation of an alternative nonvolatile semiconductor memory device according to the first embodiment.
Figures 9C, 9D:
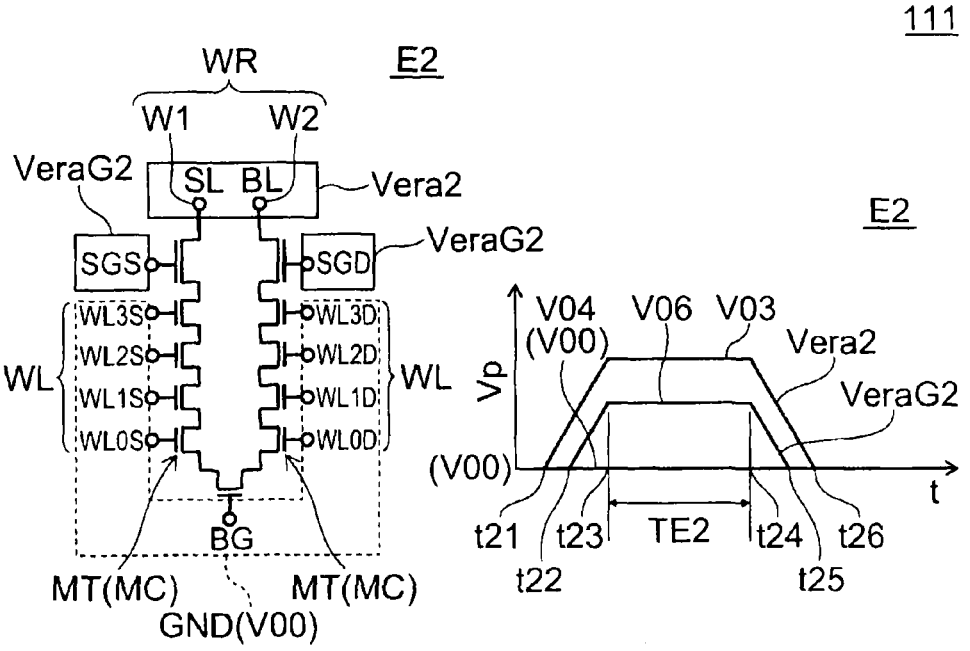

More specifically, FIGS. 9A and 9B are a schematic diagram and a graph, respectively, illustrating the state of potential in the first operation E1. FIGS. 9C and 9D are a schematic diagram and a graph, respectively, illustrating the state of potential in the second operation E2. In FIGS. 9B and 9D, the horizontal axis represents time t, and the vertical axis represents potential Vp.

Figures 10A, 10B, 10C:
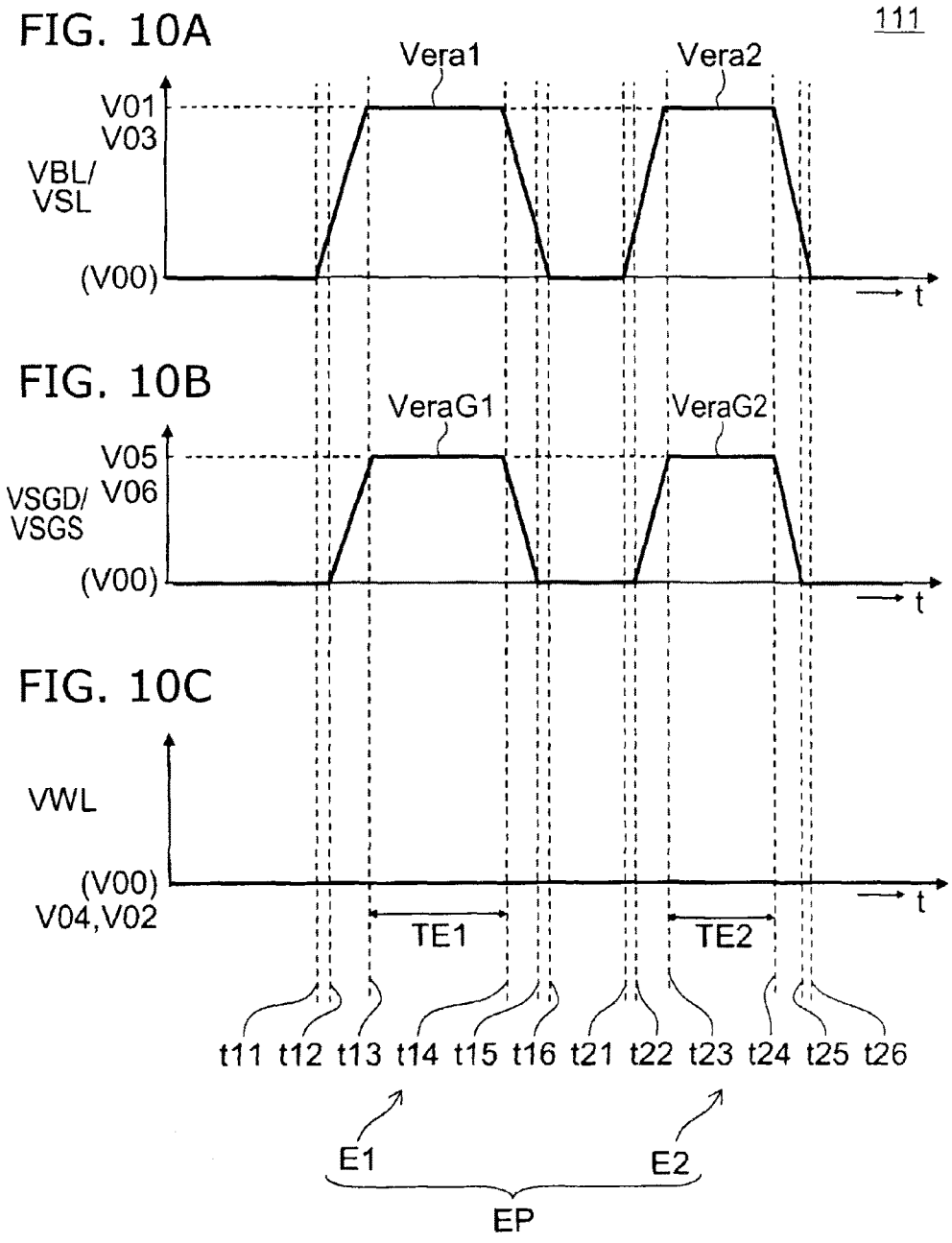
FIGS. 10A to 10C are schematic diagrams illustrating the operation of the alternative nonvolatile semiconductor memory device according to the first embodiment.

FIGS. 10A to 10C are schematic diagrams illustrating the operation of the alternative nonvolatile semiconductor memory device according to the first embodiment.

More specifically, FIGS. 10A, 10B, and 10C show, in the first operation E1 and the second operation E2, the potential of the first wiring W1 (the potential VSL of the source line SL) and the potential of the second wiring W2 (the potential VBL of the bit line BL); the potential VSGD of the drain side select gate SGD and the potential VSGS of the source side select gate SGS; and the potential VWL of the electrode film WL, respectively.

As shown in FIGS. 9A and 9B, in the nonvolatile semiconductor memory device 111, the control unit CTU sets the wiring WR (e.g., first wiring W1 and second wiring W2) at a first potential V01 and the electrode film WL at a second potential V02 lower than the first potential V01.

For instance, as shown in FIGS. 10A to 10C, during the first period TE1 of the first operation E1, the first erase voltage Vera1 applied to the wiring WR rises from the reference potential V00 at time t11, reaches the first potential V01 at time t13, then keeps the first potential V01 until time t14, starts falling at time t14, and returns to the reference potential V00 at time t16. The period from time t13 to time t14 is the first period TE1.

The first erase-time select gate voltage VeraG1 applied to the source side select gate SGS and the drain side select gate SGD rises from the reference potential V00 at time t12, reaches a fifth potential V05 at time t13, then keeps the fifth potential V05 until time t14, starts falling at time t14, and returns to the reference potential V00 at time t15. Again, it is noted that the time of reaching the fifth potential V05 and the time of starting falling from the fifth potential V05 may be different from the time t13 of reaching the first potential V01 and the time t14 of starting falling from the first potential V01.

In the first operation E1, the potential of the electrode film WL and the back gate BG is constant at the second potential V02 (reference potential V00).

The first potential V01 is illustratively 20 V, the fifth potential V05 is illustratively 15 V, and the second potential V02 (reference potential V00) is illustratively 0 V.

Time t12 comes after time t11, time t13 comes after time t12, time t14 comes after time t13, time t15 comes after time t14, and time t16 comes after time t15.

The first erase voltage Vera1 is not less than the first erase-time select gate voltage VeraG1 at any time.

Thus, GIDL is generated, and holes are injected into the memory layer 48 (first memory layer 48a and second memory layer 48b) of the memory transistor MT.

Here, again, the first erase voltage Vera1 is set to a voltage such that the threshold voltage of the memory transistor MT is slightly higher than the target value of the erase state. For instance, when the target threshold voltage is −2 V, the threshold voltage of the memory transistor MT is set to approximately −1 V.

Subsequently, as shown in FIGS. 9C and 9D, in the second operation E2, the control unit CTU sets the wiring WR (e.g., first wiring W1 and second wiring W2) at a third potential V03 and the electrode film WL at a fourth potential V04 lower than the third potential V03. Here, it is assumed that the fourth potential V04 is equal to the second potential V02. Furthermore, in this case, the difference between the third potential V03 and the fourth potential V04 is equal to the difference between the first potential V01 and the second potential V02. That is, the third potential V03 is equal to the first potential V01, or 20 V.

Furthermore, the period for which the third potential V03 (equal to the first potential V01 in this case) is applied in the second operation E2 is shorter than the period for which the first potential V01 is applied in the first operation E1.

For instance, as shown in FIGS. 10A to 10C, in the second operation E2, the second erase voltage Vera2 rises from the reference potential V00 at time t21, reaches the third potential V03 at time t23, then keeps the third potential V03 until time t24, starts falling at time t24, and returns to the reference potential V00 at time t26. In this example, the period from time t23 to time t24 is the second period TE2. The length of the second period TE2 is shorter than the length of the first period TE1.

Also in this case, the second erase-time select gate voltage VeraG2 rises from the reference potential V00 at time t22, reaches a sixth potential V06 at time t23, then keeps the sixth potential V06 until time t24, starts falling at time t24, and returns to the reference potential V00 at time t25. Again, the time of reaching the sixth potential V06 and the time of starting falling from the sixth potential V06 may be different from the time t23 of reaching the third potential V03 and the time t24 of starting falling from the third potential V03.

In the second operation E2, the potential of the electrode film WL and the back gate BG is constant at the fourth potential V04, which is equal to the second potential V02, or the reference potential V00.

The third potential V03 is equal to the first potential V01, such as 20 V. The sixth potential V06 is equal to the fifth potential V05, such as 15 V.

Time t22 comes after time t21, time t23 comes after time t22, time t24 comes after time t23, time t25 comes after time t24, and time t26 comes after time t25.

The second erase voltage Vera2 is not less than the second erase-time select gate voltage VeraG2 at any time.

Thus, GIDL is generated, and holes are injected into the memory layer 48 (first memory layer 48a and second memory layer 48b) of the memory transistor MT.

As described above, the first period TE1 for which the first operation E1 is performed is set to the period for which the first erase voltage Vera1 is the first potential V01. Furthermore, the second period TE2 for which the second operation E2 is performed is set to the period for which the second erase voltage Vera2 is the third potential V03 (equal to the first potential V01 in this example). The second period TE2 is shorter than the first period TE1.

By this second operation E2, the threshold voltage, which has been set slightly higher by the first operation E1, is slightly lowered and set to the target value. That is, the threshold voltage of the memory transistor MT is set to the target threshold value, such as −2 V.

The foregoing has described the example in which the length of the second period TE2 of the second operation E2 is equal to the length of the first period TE1 of the first operation E1 whereas the difference between the third potential V03 and the fourth potential V04 is smaller than the difference between the first potential V01 and the second potential V02 and the example in which the length of the second period TE2 of the second operation E2 is shorter than the length of the first period TE1 of the first operation E1 whereas the difference between the third potential V03 and the fourth potential V04 is equal to the difference between the first potential V01 and the second potential V02. However, it is only necessary to satisfy at least one of: the length of the second period TE2 of the second operation E2 being shorter than the length of the first period TE1 of the first operation E1; and the difference between the third potential V03 and the fourth potential V04 being smaller than the difference between the first potential V01 and the second potential V02.

In the nonvolatile semiconductor memory device according to this embodiment, the control unit CTU can further perform a verify read operation as described below.

Figure 11A:
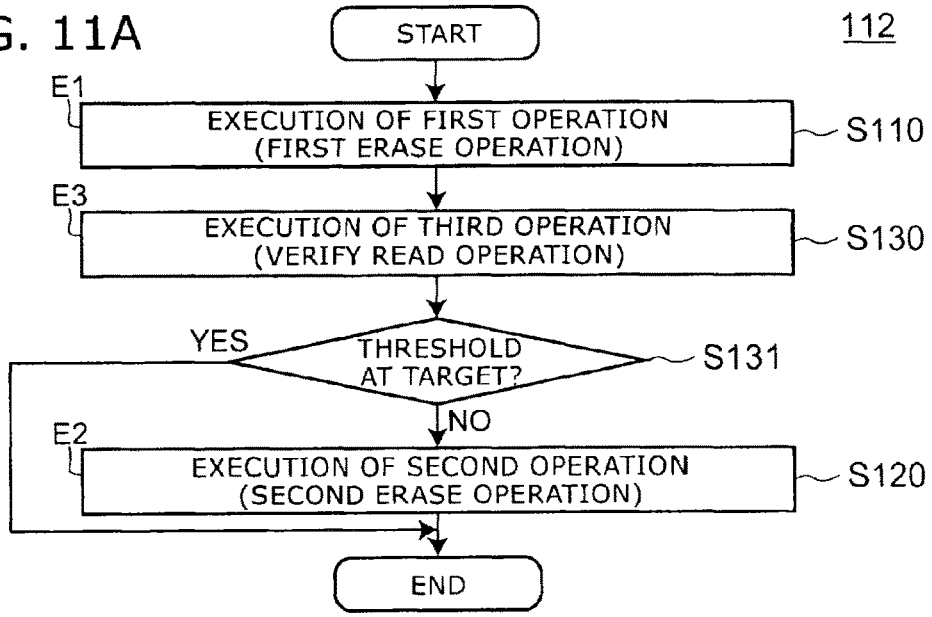
FIGS. 11A and 11B are flow charts illustrating the operation of an alternative nonvolatile semiconductor memory device according to the first embodiment.
Figure 11B:
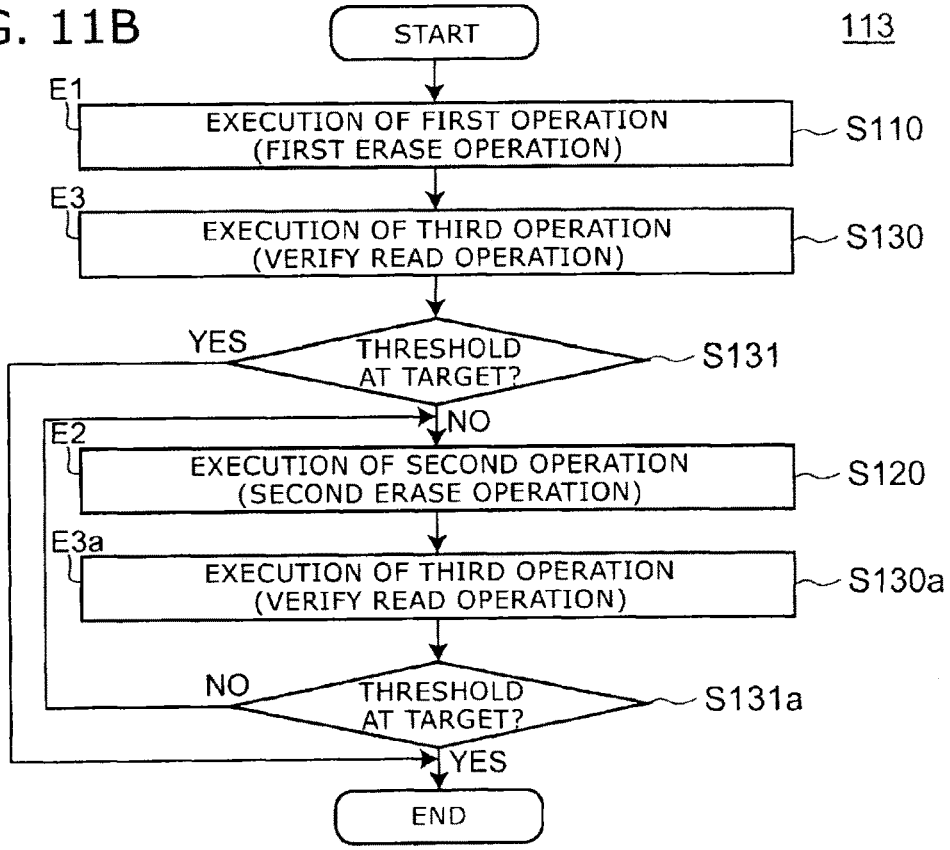

FIGS. 11A and 11B are flow charts illustrating the operation of an alternative nonvolatile semiconductor memory device according to the first embodiment.

As shown in FIG. 11A, between the first operation E1 (step S110) and the second operation E2 (step S120), an alternative nonvolatile semiconductor memory device 112 according to this embodiment performs a third operation E3 (step S130) for reading the threshold voltage of the memory transistor MT formed at the intersection between the semiconductor pillar SP and the electrode film WL.

The configuration of the nonvolatile semiconductor memory device 112 can be the same as that of the nonvolatile semiconductor memory devices 110 and 111, and hence the description thereof is omitted.

The third operation E3 is the so-called verify read operation.

In the third operation E3, for instance, the first wiring W1 (source line SL) is set at a second potential V02 (e.g., 0 V), the second wiring W2 (bit line BL) is set at a low potential Vcc (e.g., approximately 3 V), the first select gate SG1 and the second select gate SG2 are set at the low potential Vcc, and the electrode film WL is set at a search potential Vse. Then, with the search potential Vse varied (that is, with the potential of the electrode film WL varied between the first potential V01 and the second potential V02), the threshold voltage of the memory transistor MT corresponding to each electrode film WL is read. This operation is also performed by the control unit CTU.

Then, if the threshold voltage of the memory transistor MT read by the third operation E3 has not reached the target value, the process proceeds to the second operation E2, and if the threshold voltage has reached the target value, the process is completed (step S131).

When the threshold voltage has not reached the target value, the second operation E2 (step S120) is performed.

Thus, in this example, the second operation E2 is performed on the basis of the state of the threshold voltage of the memory transistor MT after the first operation E1. Thus, in the erase operation EP, the control unit CTU performs an operation including the execution of the first operation E1 and the execution of the second operation E2.

Thus, the second operation E2 can be performed as needed, and the erase operation EP can be performed efficiently.

As shown in FIGS. 11B, in a nonvolatile semiconductor memory device 113 according to this embodiment, a third operation E3a (step S130a) for reading the threshold voltage of the memory transistor MT formed at the intersection between the semiconductor pillar SP and the electrode film WL is performed after the second operation E2.

The configuration of the nonvolatile semiconductor memory device 113 can be the same as that of the nonvolatile semiconductor memory devices 110 and 111, and hence the description thereof is omitted.

The third operation E3a is also the verify read operation. In the third operation E3a, an operation similar to the aforementioned third operation E3 is performed.

If the threshold voltage of the memory transistor MT read by the third operation E3a has not reached the target value, the process returns to the second operation E2, and if the threshold voltage has reached the target value, the process is completed (step S131a). Then, the aforementioned step S120, step S130a, and step S131a are repeated until the threshold voltage reaches the target value.

In this example, between the first operation E1 (step S110) and the second operation E2 (step S120), the aforementioned third operation E3 (step S130) is performed. If the threshold voltage of the memory transistor MT read by the third operation E3 has not reached the target value, the process proceeds to the second operation E2, and if the threshold voltage has reached the target value, the process is completed (step S131).

Then, after the second operation E2, the aforementioned step S130a and step S131a are performed.

More specifically, the third operation E3a is performed after the second operation E2. During a third period after the third operation E3a, the control unit CTU performs an operation (corresponding to a second additional erasure) for setting the first wiring W1 at an eighth potential and setting the electrode film WL at a ninth potential lower than the eighth potential. Here, at least one of the following is satisfied: the length of the third period being shorter than the length of the second period; and the difference between the eighth potential and the ninth potential being smaller than the difference between the third potential V03 and the fourth potential V04.

The ninth potential is illustratively equal to the fourth potential V04, that is, equal to the second potential V02.

However, the invention is not limited thereto. It is also possible to omit step S130 and step S131, perform step S110 and step S120, then perform step S130a and step S131a, repeating the aforementioned step S120, step S130a, and step S131a until the threshold voltage reaches the target value.

That is, the third operation E3 (or third operation E3a) can be performed at least one of between the first operation El and the second operation E2 and after the second operation E2.

Thus, the second operation E2 can be repeated as needed, and the erase operation EP can be performed efficiently.

In the case of repeating the second operation E2, at least one of the second period TE2 of the second operation E2 and the difference between the third potential V03 and the fourth potential V04 may be varied with the number of repetitions. Thus, the erase operation EP can be performed more efficiently.

FIGS. 12A to 12D are schematic diagrams illustrating the operation of an alternative nonvolatile semiconductor memory device according to the first embodiment.

Figure 12A:
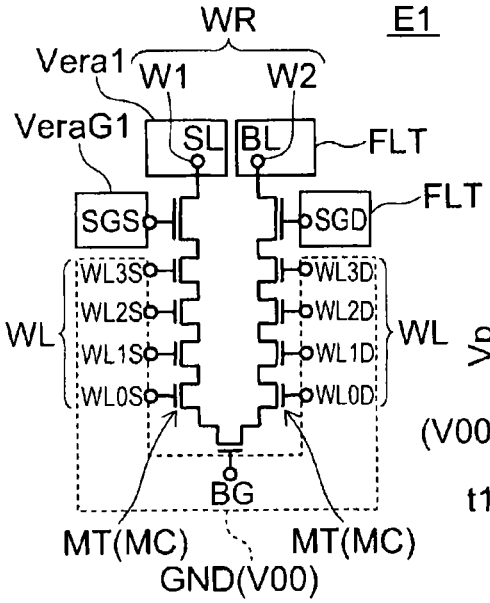
FIGS. 12A to 12D are schematic diagrams illustrating the operation of an alternative nonvolatile semiconductor memory device according to the first embodiment.
Figure 12B:
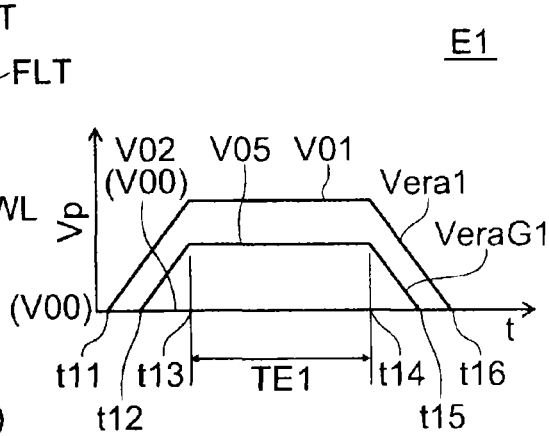
Figure 12C:
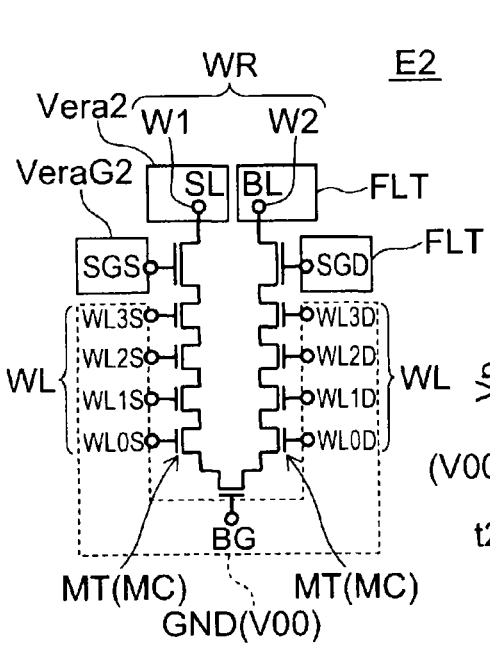
Figure 12D:
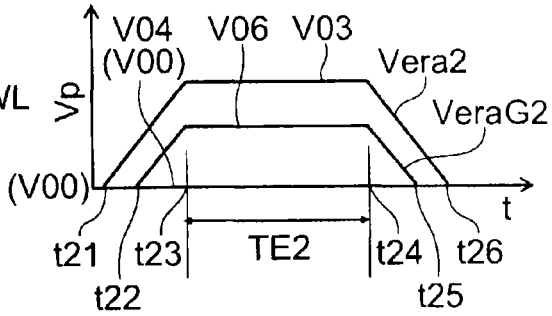

More specifically, FIGS. 12A and 12B are a schematic diagram and a graph, respectively, illustrating the state of potential in the first operation E1. FIGS. 12C and 12D are a schematic diagram and a graph, respectively, illustrating the state of potential in the second operation E2. In FIGS. 12B and 12D, the horizontal axis represents time t, and the vertical axis represents potential Vp.

As shown in FIGS. 12A to 12D, in the operation of an alternative nonvolatile semiconductor memory device 114 according to this embodiment, an erase voltage (first erase voltage Vera1) is applied to the first wiring W1 (source line SL), but the second wiring W2 (bit line BL) is set in the floating state FLT. Here, an erase-time select gate voltage (first erase-time select gate voltage VeraG1) is applied to the first select gate SG1 (source side select gate SGS), but the second select gate SG2 (drain side select gate SGD) on the second wiring W2 side is set in the floating state FLT.

More specifically, the memory unit MU further includes a second semiconductor pillar SP2 provided adjacent to the first semiconductor pillar SP1 in the second direction (Y-axis direction) orthogonal to the first direction (Z-axis direction) and piercing the multilayer structure ML in the first direction, a second memory layer 48b provided between each electrode film WL and the second semiconductor pillar SP2, a second inner insulating film 42b provided between the second memory layer 48b and the second semiconductor pillar SP2, a second outer insulating film 43b provided between each electrode film WL and the second memory layer 48b, a second wiring W2 electrically connected to one end (second end) of the second semiconductor pillar SP2, a connecting portion CP (first connecting portion CP1) electrically connecting the other end (third end) opposite to the one end (first end) of the first semiconductor pillar SP1 and the other end (fourth end) opposite to the one end (second end) of the second semiconductor pillar SP2, a first select gate SG1 provided between the one end (first end) of the first semiconductor pillar SP1 and the multilayer structure ML and pierced by the first semiconductor pillar SP1, and a second select gate SG2 provided between the one end (second end) of the second semiconductor pillar SP2 and the multilayer structure ML and pierced by the second semiconductor pillar SP2.

During the first period TE1 of the first operation E1, the control unit CTU sets the first wiring W1 at a first potential V01, the second wiring W2 in the floating state FLT, and the electrode film WL at a second potential V02 lower than the first potential V01.

Then, during the second period TE2 of the second operation E2 after the first operation E1, the control unit CTU sets the first wiring W1 at a third potential V03, the second wiring W2 in the floating state FLT, and the electrode film WL at a fourth potential V04 lower than the third potential V03.

Furthermore, during the first period TE1 of the first operation E1, the first select gate SG1 is set at a fifth potential V05, which is lower than the first potential V01 and higher than the second potential V02. Here, the second select gate SG2 is preferably set in the floating state FLT.

Then, during the second period TE2 of the second operation E2, the first select gate SG1 is set at a sixth potential V06, which is lower than the third potential V03 and higher than the fourth potential V04. Here, the second select gate SG2 is preferably set in the floating state FLT.

Thus, if the erase voltage (first erase voltage Vera1 and second erase voltage Vera2) and the erase-time select gate voltage (first erase-time select gate voltage VeraG1 and second erase-time select gate voltage VeraG2) are applied, respectively, to the first wiring W1 and the first select gate SG1 corresponding to one end of a memory string, then the second wiring W2 and the second select gate SG2 corresponding to the other end of the memory string may be in the floating state FLT.

Second Embodiment

FIGS. 13A to 13D are schematic diagrams illustrating the operation of a nonvolatile semiconductor memory device according to a second embodiment.

Figures 13A, 13B:
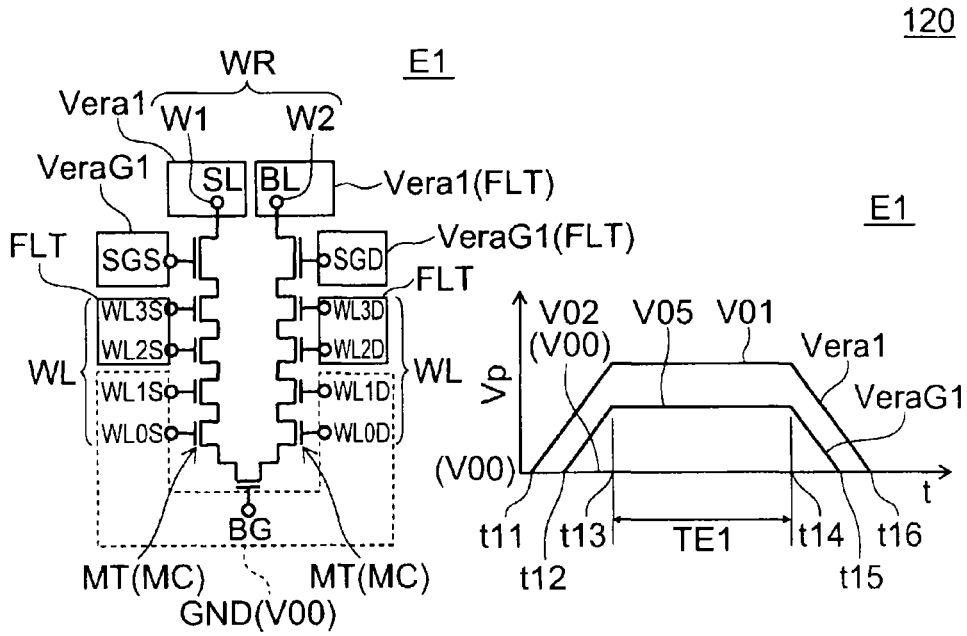
FIGS. 13A to 13D are schematic diagrams illustrating the operation of a nonvolatile semiconductor memory device according to a second embodiment.
Figures 13C, 13D:
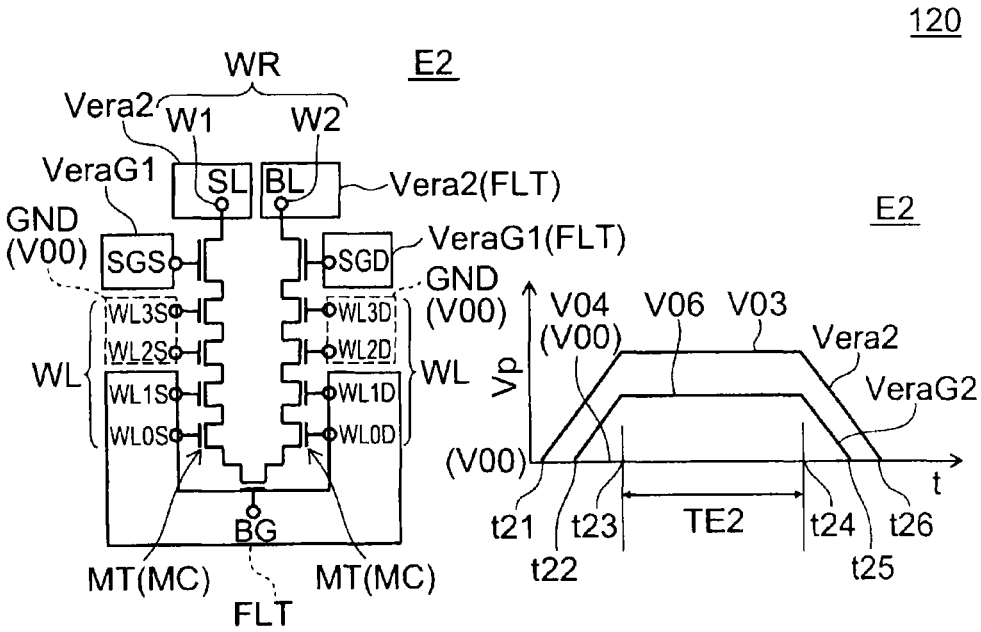

More specifically, FIGS. 13A and 13B are a schematic diagram and a graph, respectively, illustrating the state of potential in the first operation E1. FIGS. 13C and 13D are a schematic diagram and a graph, respectively, illustrating the state of potential in the second operation E2. In FIGS. 13B and 13D, the horizontal axis represents time t, and the vertical axis represents potential Vp.

In this embodiment, the second operation E2 does not necessarily need to be performed as a combination with the first operation E1 after the first operation E1, but the first operation E1 and the second operation E2 may be performed independently.

As shown in FIG. 13A, in a nonvolatile semiconductor memory device 120 according to this embodiment, the control unit CTU sets the wiring WR (e.g., first wiring W1 and second wiring W2) at a first potential V01 when performing at least one operation of: injection of holes into one memory layer 48 (one memory section, selected memory layer 48) of a plurality of memory layers 48; and extraction of electrons from the one memory layer 48 (the one memory section, selected memory layer 48).

Furthermore, the electrode film WL opposed to the one memory layer 48 (the one memory section) is set at a second potential V02 lower than the first potential V01, and the electrode films WL opposed to the memory layers 48 (memory section) except the one memory layer 48 (the one memory section) are set in the floating state FLT.

In this example, the electrode films WL0S, WL1S, WL0D, and WL1D opposed to the selected memory layers 48 are grounded to the reference potential V00, which is the second potential V02, and the electrode films WL2S, WL3S, WL2D, and WL3D opposed to the other memory layers 48 are set in the floating state FLT.

By this operation, a memory transistor MT corresponding to a particular electrode film WL can be selectively erased. In this example, the memory transistors MT corresponding to the electrode films WL0S, WL1S, WL0D, and WL1D are selectively erased.

On the other hand, because the electrode films WL2S, WL3S, WL2D, and WL3D are set in the floating state FLT, these electrode films WL are boosted by capacitive coupling. Hence, no potential difference occurs between the electrode films WL and the wiring WR. Thus, erasure is not performed in the memory transistors MT corresponding to these electrode films WL.

Here, at least one of the erase voltage (first erase voltage Vera1) and the length of the first period TE1 can be optimally adapted to these memory transistors MT.

For instance, the size of the through hole TH provided in the multilayer structure ML may be nonuniform depending on the distance from the substrate 11. For instance, in comparison between the lower portion (substrate-proximal portion) near the substrate 11 and the upper portion (substrate-distal portion) at farther distance from the substrate 11 than the lower portion, the through hole TH in the upper portion may have a larger diameter, and hence a larger curvature radius. In this case, a relatively larger potential difference is applied between the wiring WR and the electrode film WL to erase the memory transistor MT in the upper portion than in the lower portion. By using an optimal erase voltage in each of the upper portion and the lower portion, each memory transistor MT can be set in a suitable erase state.

For instance, the first potential V01, which is the maximum of the first erase voltage Vera1, is illustratively 20 V, and the second potential V02 is the reference potential V00, or the ground potential GND (0 V).

Here, the setting of the potential of the first select gate SG1 and the second select gate SG2 (fifth potential V05, or first erase-time select gate voltage VeraG1) can be the same as that described with reference to FIGS. 6A to 6D, and hence the description thereof is omitted.

By using the voltage as described above, only the desired memory transistor MT can be erased by an optimal erase voltage. Thus, the erase state can be made uniform, which can improve controllability in the subsequent write operation, for instance. Furthermore, this improves retention characteristics, stabilizes the erase state, and also suppresses erroneous write. Furthermore, selective erasure of only the desired memory transistor MT serves to improve reliability and accelerate the erase operation.

In the second operation E2 shown in FIG. 13C, the electrode films WL2S, WL3S, WL2D, and WL3D are grounded to the reference potential V00, which is the fourth potential V04, and the electrode films WL0S, WL1S, WL0D, and WL1D opposed to the other memory layers 48 are set in the floating state FLT.

By this operation, the memory transistors MT corresponding to the electrode films WL2S, WL3S, WL2D, and WL3D are selectively erased.

Here, at least one of the erase voltage (second erase voltage Vera2) and the length of the second period TE2 can be optimally adapted to these memory transistors MT.

The third potential V03, which is the maximum of the second erase voltage Vera2, is illustratively 19 V, and the fourth potential V04 is the reference potential V00, or the ground potential GND (0 V).

Here, the setting of the potential of the first select gate SG1 and the second select gate SG2 (sixth potential V06, or the maximum of the second erase-time select gate voltage VeraG2) can be the same as that described with reference to FIGS. 6A to 6D, and hence the description thereof is omitted.

By using the voltage as described above, only the desired memory transistor MT can be erased by an optimal erase voltage. Thus, the erase state can be made uniform, which can improve controllability in the subsequent write operation, for instance. Furthermore, this improves retention characteristics, stabilizes the erase state, and also suppresses erroneous write. Furthermore, selective erasure serves to improve reliability and accelerate the erase operation.

Thus, in a selective first erase operation EP on a first selected memory layer 48 (one memory layer 48 of a plurality of memory layers 48, memory section), during the first period TE1, the control unit CTU performs a first operation E1 for setting the wiring WR (first wiring W1 and second wiring W2) at a first potential V01, setting the electrode film WL opposed to the first selected memory layer 48 at a second potential V02 lower than the first potential V01, and setting the electrode film WL opposed to first non-selected memory layers 48 (the memory layers 48 except the first selected memory layer 48, memory section) in the floating state FLT. Furthermore, during the second period TE2 (e.g., after the first period TE1), in a selective second erase operation EP on a second selected memory layer 48 (another memory layer 48 of a plurality of memory layers 48, memory sections) other than the first selected memory layer 48 (the memory section), the control unit CTU can perform a second operation E2 for setting the wiring WR (first wiring W1 and second wiring W2) at a third potential V03, setting the electrode film WL opposed to the second selected memory layer 48 (the memory section) at a fourth potential V04 lower than the third potential V03, and setting the electrode film WL opposed to second non-selected memory layers 48 (the memory layers 48 except the second selected memory layer 48, the memory section)) in the floating state FLT.

Furthermore, at least one of the following may be satisfied: the length of the second period TE2 being different from the length of the first period TE1; and the difference between the third potential V03 and the fourth potential V04 being different from the difference between the first potential V01 and the second potential V02.

Hence, each desired memory transistor MT can be selectively erased by an optimal erase voltage. Thus, the erase state can be made more uniform.

Furthermore, also in this case, as described with reference to FIG. 12, in the first operation E1, with the first wiring W1 set at a first potential V01, the second wiring W2 can be set in the floating state FLT, and with the first select gate SG1 set at a fifth potential V05, the second select gate SG2 can be set in the floating state FLT. Furthermore, in the second operation E2, with the first wiring W1 set at a third potential V03, the second wiring W2 can be set in the floating state FLT, and with the first select gate SG1 set at a sixth potential V06, the second select gate SG2 can be set in the floating state FLT.

Third Embodiment

FIGS. 14A to 14F are schematic diagrams illustrating the operation of a nonvolatile semiconductor memory device according to a third embodiment.

Figure 14A:
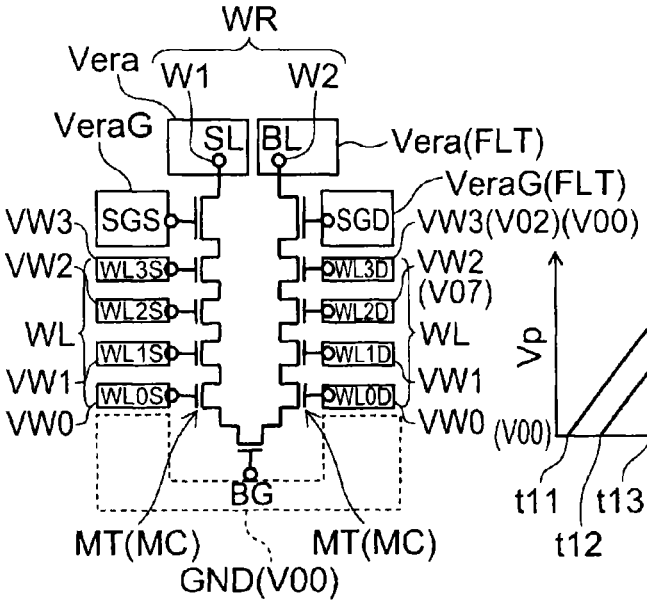
FIGS. 14A to 14F are schematic diagrams illustrating the operation of a nonvolatile semiconductor memory device according to a third embodiment.
Figure 14B:
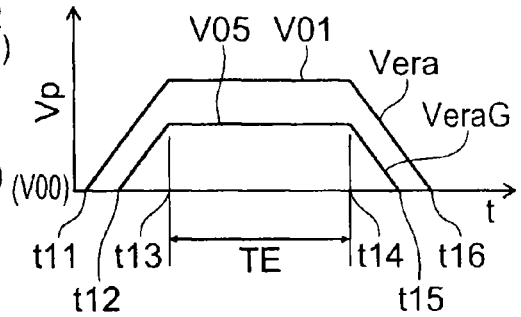
Figure 14C:
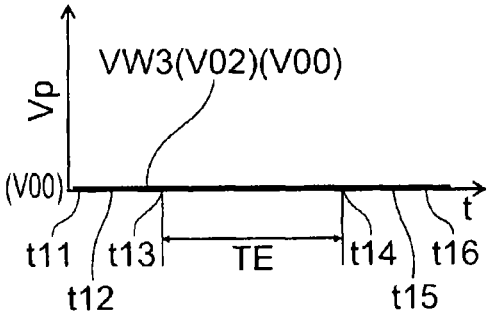
Figure 14D:
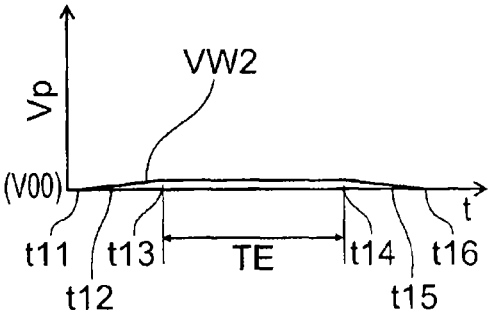
Figure 14E:
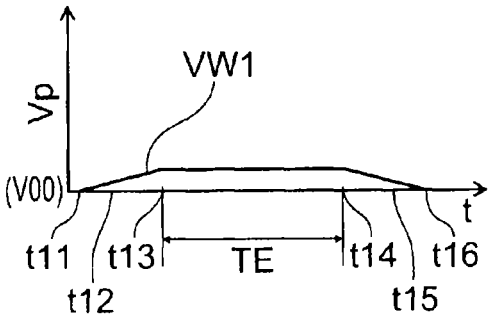
Figure 14F:
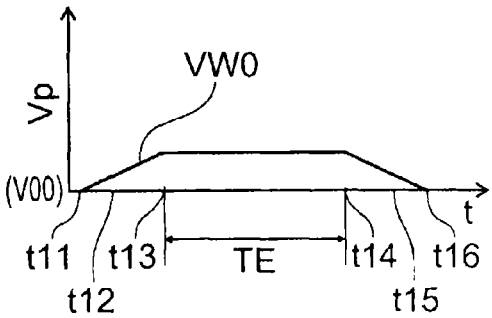

More specifically, FIG. 14A is a schematic diagram illustrating the state of potential in a nonvolatile semiconductor memory device 130. FIGS. 14B to 14F are graphs illustrating the state of potential, where FIG. 14B shows the erase voltage Vera and the erase-time select gate voltage VeraG, and FIGS. 14C to 14F show, respectively, the application voltage VWL3 to the electrode films WL3S and WL3D, the application voltage VWL2 to the electrode films WL2S and WL2D, the application voltage VWL1 to the electrode films WL1S and WL1D, and the application voltage VWL0 to the electrode films WL0S and WL0D.

As shown in FIGS. 14A to 14F, the control unit CTU performs the following process in the operation of performing at least one of: injection of holes into the memory layer 48; and extraction of electrons from the memory layer 48.

The control unit CTU sets the wiring WR (e.g., first wiring W1 and second wiring W2) at a first potential V01 and one electrode film WL of a plurality of electrode films WL at a second potential V02 lower than the first potential V01. Furthermore, the control unit CTU sets another electrode film WL of the plurality of electrode films WL at a seventh potential V07, which is lower than the first potential V01 and different from the second potential V02.

The first potential V01 is illustratively 20 V, and the second potential V02 is illustratively the reference potential V00, or 0 V.

The erase voltage Vera, the erase-time select gate voltage VeraG, the fifth potential V05, the period TE, and time t11, t12, t13, t14, t15, and t16 illustrated in FIG. 14B can be the same as the first erase voltage Vera1, the first erase-time select gate voltage VeraG1, the fifth potential V05, the first period TE1, and time t11, t12, t13, t14, t15, and t16 described with reference to FIGS. 6A to 6D, and hence the description thereof is omitted.

In the first operation E1 illustrated in FIGS. 6A to 6D, all the electrode films WL are simultaneously set at the second potential V02. However, in the nonvolatile semiconductor memory device 130 according to this embodiment, at least two of the electrode films WL are set at different potentials.

For instance, the application voltage VWL3 to the electrode films WL3S and WL3D is constant at the second potential V02 (reference potential V00), or 0 V. The maximum of the application voltage VWL2 to the electrode films WL2S and WL2D is illustratively 1 V. The maximum of the application voltage VWL1 to the electrode films WL1S and WL1D is illustratively 2 V. The maximum of the application voltage VWL0 to the electrode films WL0S and WL0D is illustratively 3 V.

Each of the application voltages VWL0 to VWL2 rises from the reference potential V00 at time t11, reaches the associated maximum potential (3 V, 2 V and 1 V) at time t13, then keeps the maximum potential until time t14, starts falling at time t14, and returns to the reference potential V00 at time t16. In this example, the period from time t13 to time t14 is the period TE.

Thus, by setting the electrode films WL independently at different potentials, each memory transistor MT opposed to the associated electrode film WL can be optimally erased.

For instance, as described above, the size of the through hole TH provided in the multilayer structure ML may be nonuniform depending on the distance from the substrate 11. For instance, as compared with the lower portion (substrate-proximal portion) near the substrate 11, the through hole TH may have a larger diameter, and hence a larger curvature radius, in the upper portion (substrate-distal portion) at farther distance from the substrate 11 than the lower portion. In this case, while the erase voltage Vera applied to the wiring WR is left constant, the electrode film WL in the upper portion having a relatively larger curvature radius is set at 0 V, and the electrode film WL in the lower portion having a relatively smaller curvature radius is set at a voltage higher than 0 V, for instance More specifically, a first region (e.g., substrate-distal portion, or upper portion) where the outer insulating film 43 has a large outer diameter along the second direction (Y-axis direction) perpendicular to the first direction (Z-axis direction), and a second region (e.g., substrate-proximal portion, or lower portion) where the outer diameter along the second direction is smaller than in the first region, are defined. The aforementioned one electrode film WL of a plurality of electrode films WL is an electrode film WL in the first region, and the aforementioned other electrode film WL of the plurality of electrode films WL is an electrode film WL in the second region. Here, the seventh potential V07 is illustratively 1 V to 3 V, which is higher than the second potential V02 (e.g., 0 V).

That is, as illustrated in FIGS. 14A to 14F, the maximum of the application voltage VWL0 to the electrode film WL0S and the electrode film WL0D, for instance, corresponding to the memory transistors MT in the lower portion is set higher than the maximum of the application voltage VWL3 to the electrode film WL3S and the electrode film WL3D corresponding to the memory transistors MT in the upper portion so that optimal potential differences are respectively applied to the memory transistors MT in the upper portion and the lower portion. Thus, each of the memory transistors MT can be set at a suitable erase state.

Also in this case, as described with reference to FIGS. 12A to 12D, with the first wiring W1 set at a first potential V01, the second wiring W2 can be set in the floating state FLT, and with the first select gate SG1 set at a fifth potential V05, the second select gate SG2 can be set in the floating state FLT.

It is noted that various operations described with reference to the first to third embodiments may be suitably combined. For instance, the second embodiment and the third embodiment can be combined. Then, the memory transistors MT opposed to different electrode films WL can be separately erased by varying the erase voltage Vera and further varying the potential VWL depending on the electrode film WL.

Fourth Embodiment

Figure 15:
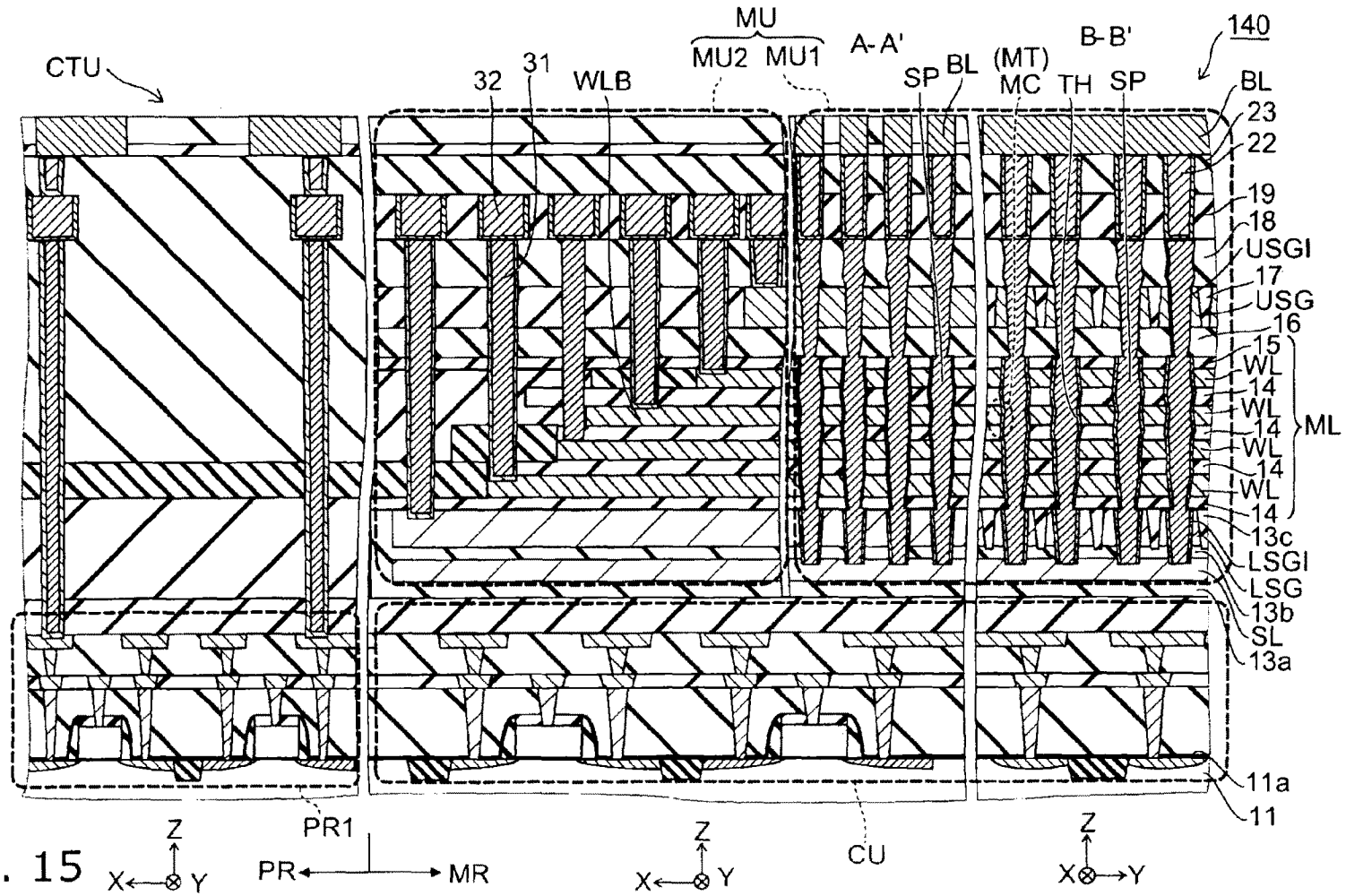
FIG. 15 is a schematic cross-sectional view illustrating the configuration of a nonvolatile semiconductor memory device according to a fourth embodiment.
Figure 16:
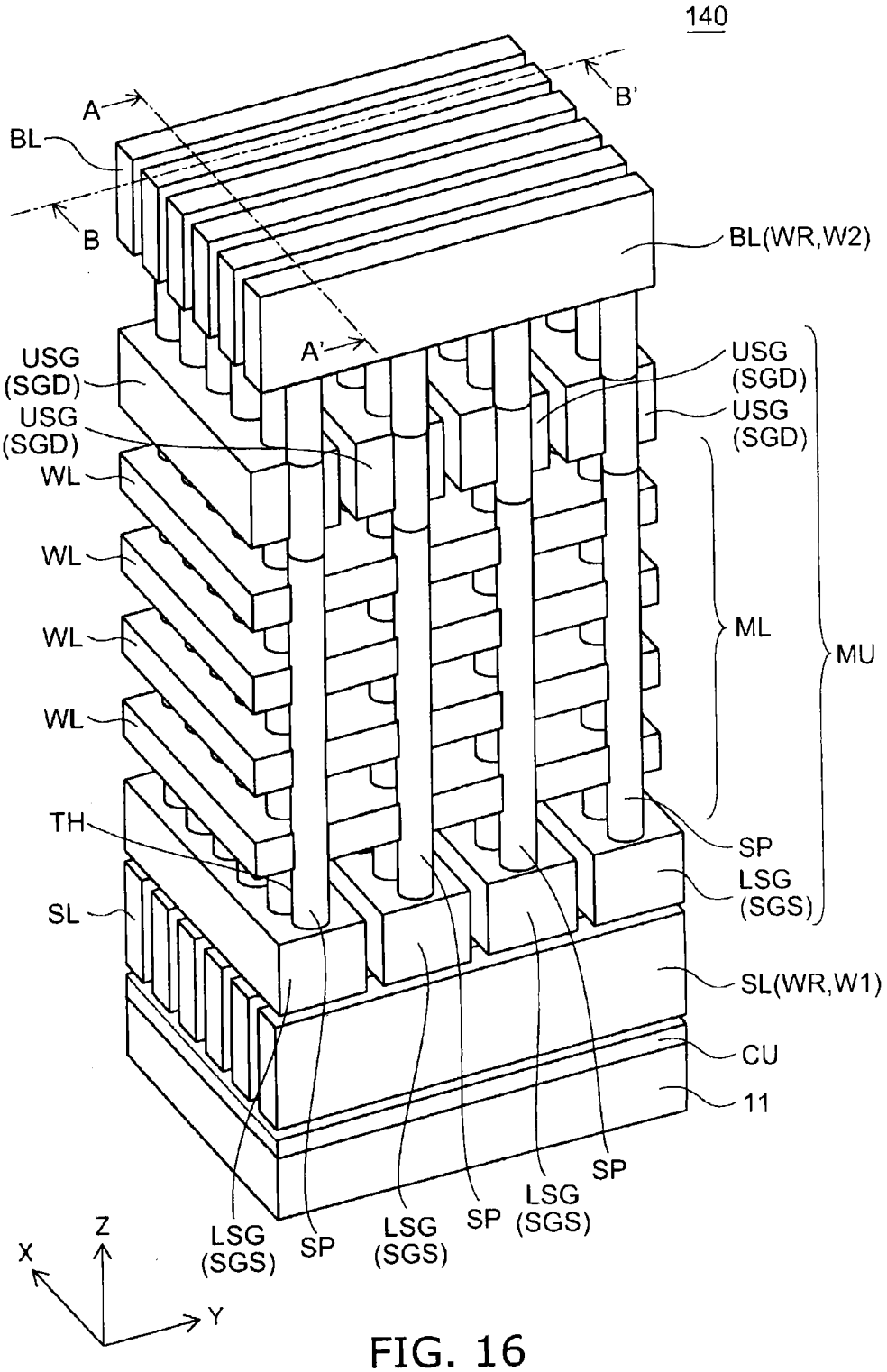
FIG. 16 is a schematic perspective view illustrating the configuration of the nonvolatile semiconductor memory device according to the fourth embodiment.

FIGS. 15 and 16 are a schematic cross-sectional view and a schematic perspective view, respectively, illustrating the configuration of a nonvolatile semiconductor memory device according to a fourth embodiment.

It is noted that for clarity of illustration, FIG. 16 shows only the conductive portions and omits the insulating portions.

As shown in FIGS. 15 and 16, a nonvolatile semiconductor memory device 140 according to this embodiment also includes a memory unit MU and a control unit CTU.

In the memory unit MU, semiconductor pillars SP are not connected in a U-shape, but are independent of each other. That is, the nonvolatile semiconductor memory device 140 includes linear NAND strings. An upper select gate USG (second select gate SG2, illustratively serving as a drain side select gate SGD) is provided above the multilayer structure ML, and a lower select gate LSG (first select gate SG1, illustratively serving as a source side select gate SGS) is provided below the multilayer structure ML.

An upper select gate insulating film USGI illustratively made of silicon oxide is provided between the upper select gate USG and the semiconductor pillar SP, and a lower select gate insulating film LSGI illustratively made of silicon oxide is provided between the lower select gate LSG and the semiconductor pillar SP.

Furthermore, a source line SL (first wiring W1, which is one of the wirings WR) is provided below the lower select gate LSG. An interlayer insulating film 13a is provided below the source line SL, and an interlayer insulating film 13b is provided between the source line SL and the lower select gate LSG.

The semiconductor pillar SP is connected to the source line SL below the lower select gate LSG and to a bit line BL (second wiring W2, which is one of the wirings WR) above the upper select gate USG. Thus, memory transistors MT (memory cells MC) are formed in the multilayer structure ML between the upper select gate USG and the lower select gate LSG, and the semiconductor pillar SP functions as one linear memory string. This memory string is illustratively a NAND string.

The upper select gate USG and the lower select gate LSG are divided in the Y-axis direction by an interlayer insulating film 17 and an interlayer insulating film 13c, respectively, and shaped like strips aligning in the X-axis direction.

On the other hand, the bit line BL connected to the upper portion of the semiconductor pillar SP and the source line SL connected to the lower portion of the semiconductor pillar SP are shaped like strips aligning in the Y-axis direction.

In this case, the electrode film WL is a plate-like conductive film parallel to the X-Y plane.

Also in the nonvolatile semiconductor memory device 140 having such a structure, the control unit CTU performs the operation described with reference to the first to third embodiments. Thus, a stable erase state can be realized.

In the nonvolatile semiconductor memory device according to the embodiments of the invention, the interelectrode insulating film 14, the inner insulating film 42, and the outer insulating film 43 can be a monolayer film made of a material selected from the group including silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a multilayer film made of a plurality of materials selected from the group.

The memory layer 48 can be a monolayer film made of a material selected from the group including silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a multilayer film made of a plurality of materials selected from the group.

In the specification of the application, "perpendicular" and "parallel" refer to not only strictly perpendicular and strictly parallel but also include, for instance, the fluctuation due to manufacturing processes, etc. It is sufficient to be substantially perpendicular and substantially parallel. The embodiments of the invention have been described with reference to examples. However, the invention is not limited to these examples. For instance, various specific configurations of the components, such as the substrate, electrode film, insulating film, insulating layer, multilayer structure, memory layer, charge storage layer, semiconductor pillar, word line, bit line, source line, wiring, memory transistor, and select gate transistor constituting the nonvolatile semiconductor memory device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the nonvolatile semiconductor memory device described above in the embodiments of the invention, and all the nonvolatile semiconductor memory devices thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention. For instance, those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

1. A nonvolatile semiconductor memory device comprising:

a memory unit; and a control unit, the memory unit including:

a multilayer structure including a plurality of electrode films and a plurality of interelectrode insulating films alternately stacked in a first direction;

a first semiconductor pillar piercing the multilayer structure in the first direction;

a first memory layer provided between each of the electrode films and the first semiconductor pillar;

a first inner insulating film provided between the first memory layer and the first semiconductor pillar;

a first outer insulating film provided between each of the electrode films and the first memory layer; and a first wiring electrically connected to one end of the first semiconductor pillar, the control unit performing:

a first operation setting the first wiring at a first potential and setting the electrode film at a second potential lower than the first potential during a first period; and an operation including a second operation setting the first wiring at a third potential and setting the electrode film at a fourth potential lower than the third potential during a second period after the first operation, the operation including the second operation having at least one of:

a length of the second period being shorter than a length of the first period; and a difference between the third potential and the fourth potential being smaller than a difference between the first potential and the second potential, the first operation and the operation including the second operation being performed in an operation for performing at least one of injection of holes into the first memory layer and extraction of electrons from the first memory layer.

2. The device according to claim 1, wherein the control unit performs a third operation reading a threshold voltage of a memory transistor formed at an intersection between the first semiconductor pillar and the electrode film at least one of after the second operation and between the first operation and the second operation.

3. The device according to claim 2, wherein the third operation is performed after the second operation, the control unit performs an operation setting the first wiring at an eighth potential and setting the electrode film at a ninth potential lower than the eighth potential during a third period after the third operation, and the operation preformed during the third period includes at least one of: a length of the third period being shorter than the length of the second period; and a difference between the eighth potential and the ninth potential being smaller than the difference between the third potential and the fourth potential.

4. The device according to claim 1, wherein the memory unit further includes a select gate stacked on the multilayer structure in the first direction and pierced by the one end of the semiconductor pillar, and the control unit sets:

the select gate at a fifth potential during the first period, the fifth potential being lower than the first potential and higher than the second potential; and the select gate at a sixth potential during the second period, the sixth potential being lower than the third potential and higher than the fourth potential.

5. The device according to claim 4, wherein a difference between the fifth potential and the second potential and a difference between the sixth potential and the second potential are lower than a breakdown voltage of a select gate transistor of the select gate.

6. The device according to claim 4, wherein a potential of the select gate starts changing from the second potential to the fifth potential after a time when a potential of the first wiring starts changing from the second potential to the first potential during the first period, and the potential of the select gate finishes changing from the fifth potential to the second potential after the time when the potential of the first wiring finishes changing from the first potential to the second potential during the second period.

7. The device according to claim 4, wherein the control unit performs a third operation reading a threshold voltage of a memory transistor formed at an intersection between the first semiconductor pillar and the electrode film at least one of after the second operation and between the first operation and the second operation, and the control unit sets the first wiring at the second potential, sets the select gate at a potential being lower than the first potential and higher than the second potential, and reads the threshold voltage of the memory transistor with the potential of the electrode film varied between the first potential and the second potential in the third operation.

8. The device according to claim 1, wherein the memory unit further includes:

a second semiconductor pillar provided adjacent to the first semiconductor pillar in a second direction orthogonal to the first direction and piercing the multilayer structure in the first direction;

a second memory layer provided between each of the electrode films and the second semiconductor pillar;

a second inner insulating film provided between the second memory layer and the second semiconductor pillar;

a second outer insulating film provided between each of the electrode films and the second memory layer;

a second wiring electrically connected to one end of the second semiconductor pillar; and a connecting portion electrically connecting between another end opposite to the one end of the first semiconductor pillar and another end opposite to the one end of the second semiconductor pillar, the control unit sets:

the second wiring in a floating state during the first period of the first operation; and the second wiring in the floating state during the second period of the second operation.

9. The device according to claim 1, wherein the memory unit further includes:

a second semiconductor pillar provided adjacent to the first semiconductor pillar in a second direction orthogonal to the first direction and piercing the multilayer structure in the first direction;

a second memory layer provided between each of the electrode films and the second semiconductor pillar;

a second inner insulating film provided between the second memory layer and the second semiconductor pillar;

a second outer insulating film provided between each of the electrode films and the second memory layer;

a second wiring electrically connected to one end of the second semiconductor pillar;

a connecting portion electrically connecting between another end opposite to the one end of the first semiconductor pillar and another end opposite to the one end of the second semiconductor pillar;

a first select gate provided between the one end of the first semiconductor pillar and the multilayer structure and pierced by the first semiconductor pillar; and a second select gate provided between the one end of the second semiconductor pillar and the multilayer structure and pierced by the second semiconductor pillar, the control unit sets:

the second wiring in a floating state;

the first select gate at a fifth potential being lower than the first potential and higher than the second potential; and the second select gate at the fifth potential or in the floating state, during the first period of the first operation, and the control unit sets:

the second wiring in the floating state;

the first select gate at a sixth potential being lower than the third potential and higher than the fourth potential; and the second select gate at the sixth potential or in the floating state, during the second period of the second operation.

10. The device according to claim 9, wherein a difference between the fifth potential and the second potential is lower than a breakdown voltage of a select gate transistor of the first select gate.

11. The device according to claim 10, wherein a difference between the sixth potential and the second potential is lower than the breakdown voltage of a select gate transistor of the second select gate.

12. The device according to claim 9, wherein the control unit performs a third operation reading a threshold voltage of a memory transistor formed at an intersection between the first semiconductor pillar and the electrode film at least one of after the second operation and between the first operation and the second operation.

13. The device according to claim 12, wherein the control unit sets the first wiring at the second potential, sets the second wiring, the first select gate, and the second select gate at a potential being lower than the first potential and higher than the second potential, and reads the threshold voltage of the memory transistor with the potential of the electrode film varied between the first potential and the second potential, in the third operation.

14. The device according to claim 1, wherein the memory layer includes a monolayer film made of a material selected from a first group including silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a multilayer film made of a plurality of materials selected from the first group.

15. The device according to claim 14, wherein at least one of the interelectrode insulating film, the inner insulating film, and the outer insulating film includes a monolayer film made of a material selected from a second group including silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a multilayer film made of a plurality of materials selected from the second group.

16. A nonvolatile semiconductor memory device comprising:

a memory unit; and a control unit, the memory unit including:

a multilayer structure including a plurality of electrode films and a plurality of interelectrode insulating films alternately stacked in a first direction;

a semiconductor pillar piercing the multilayer structure in the first direction;

a memory layer provided between each of the electrode films and the semiconductor pillar;

an inner insulating film provided between the memory layer and the semiconductor pillar;

an outer insulating film provided between each of the electrode films and the memory layer; and a wiring electrically connected to one end of the semiconductor pillar, and the control unit setting:

the wiring at a first potential; and the electrode film opposed to one of memory sections of the memory layer facing the plurality of electrode films at a second potential lower than the first potential and the electrode film opposed to the memory section except the one of memory sections in a floating state, the setting being performed in an operation for performing at least one of injection of holes into the one memory section and extraction of electrons from the one memory section.

17. The device according to claim 16, wherein the one memory section is a first selected memory section, the control unit sets:

the wiring at the first potential, the electrode film opposed to the first selected memory section at the second potential lower than the first potential, and the electrode film opposed to the memory sections except the first selected memory section in the floating state during a first period in the operation for performing at least one of injection of holes into the first selected memory section and extraction of electrons from the first selected memory section; and the wiring at a third potential, the electrode film opposed to a second selected memory section at a fourth potential lower than the third potential, and the electrode film opposed to the memory section except the second selected memory section in the floating state during a second period after the first period in an operation for performing at least one of injection of holes into the second selected memory section of the plurality of memory sections other than the first selected memory section and extraction of electrons from the second selected memory section, the operation performed during the second period including at least one of:

a length of the second period being different from a length of the first period; and a difference between the third potential and the fourth potential being different from a difference between the first potential and the second potential.

18. The device according to claim 17, wherein the memory unit further includes:

a second semiconductor pillar provided adjacent to the first semiconductor pillar in a second direction orthogonal to the first direction and piercing the multilayer structure in the first direction;

a second memory layer provided between each of the electrode films and the second semiconductor pillar;

a second inner insulating film provided between the second memory layer and the second semiconductor pillar;

a second outer insulating film provided between each of the electrode films and the second memory layer;

a second wiring electrically connected to one end of the second semiconductor pillar;

a connecting portion electrically connecting between another end opposite to the one end of the first semiconductor pillar and another end opposite to the one end of the second semiconductor pillar;

a first select gate provided between the one end of the first semiconductor pillar and the multilayer structure and pierced by the first semiconductor pillar; and a second select gate provided between the one end of the second semiconductor pillar and the multilayer structure and pierced by the second semiconductor pillar, the control unit setting:

the second wiring in a floating state;

the first select gate at a fifth potential being lower than the first potential and higher than the second potential; and the second select gate at the fifth potential or in the floating state, during the first period of the operation, and the control unit setting:

the second wiring in the floating state;

the first select gate at a sixth potential being lower than the third potential and higher than the fourth potential; and the second select gate at the sixth potential or in the floating state, during the second period of the operation.

19. A nonvolatile semiconductor memory device comprising:

a memory unit; and a control unit, the memory unit including:

a multilayer structure including a plurality of electrode films and a plurality of interelectrode insulating films alternately stacked in a first direction;

a semiconductor pillar piercing the multilayer structure in the first direction;

a memory layer provided between each of the electrode films and the semiconductor pillar;

an inner insulating film provided between the memory layer and the semiconductor pillar;

an outer insulating film provided between each of the electrode films and the memory layer; and a wiring electrically connected to one end of the semiconductor pillar, and the control unit setting:

the wiring at a first potential one electrode film of the plurality of electrode films at a second potential lower than the first potential; and another electrode film of the plurality of electrode films at a seventh potential lower than the first potential and different from the second potential, the setting being performed in an operation for performing at least one of injection of holes into the memory layer and extraction of electrons from the memory layer.

20. The device according to claim 19, wherein the memory unit includes a first region and a second region, an outer diameter of the outer insulating film along a second direction perpendicular to the first direction in the first region is larger than an outer diameter of the outer insulating film along the second direction in the second region, the one electrode film of the plurality of electrode films is an electrode film in the first region, and the another electrode film of the plurality of electrode films is an electrode film in the second region, and the seventh potential is higher than the second potential.

*21. A nonvolatile semiconductor memory device comprising:*

*a block including a first memory string and a second memory string, the first memory string including a first memory cell and a second memory cell being connected to the first memory cell in series, the second memory cell being disposed above the first memory cell, the second memory string including a third memory cell and a fourth memory cell being connected to the third memory cell in series, the third memory cell being disposed above the fourth memory cell;*

*a first word line connected to the first memory cell;*

*a second word line connected to the second memory cell;*

*a third word line connected to the third memory cell;*

*a fourth word line connected to the fourth memory cell; and*

*a control circuit that applies a first voltage to the first word line and the third word line in an erase operation and to apply a second voltage to the second word line and the fourth word line in the erase operation, the first voltage being different from the second voltage, the erase operation being performed for the first memory cell, the second memory cell, the third memory cell, and the fourth memory cell.*

*22. The device according to claim 21, further comprising:*

*a first wiring connected to one end of the first memory string,*

*wherein the control circuit applies a third voltage to the first wiring.*

*23. The device according to claim 22, further comprising:*

*a semiconductor substrate;*

*a first silicon material, the first silicon material being included in the first memory string and extending in a first direction crossing to the semiconductor substrate; and*

*a first select gate transistor having a first gate electrode, and one end of the first select gate transistor connecting to the first silicon material and the other end of the first select gate transistor connecting to the first wiring,*

*wherein, in the erase operation, the control circuit applies a fourth voltage different from the third voltage to the first gate electrode.*

*24. The device according to claim 21, further comprising:*

*a fifth word line connected to a first memory cell, the fifth word line included in the first memory string, and the fifth word line disposed above the second word line,*

*wherein, in the erase operation, the control circuit applies a fifth voltage to the fifth word line, the fifth voltage being different from the first voltage and the second voltage.*

*25. The device according to claim 24, wherein the second voltage is between the first voltage and the fifth voltage.*

*26. The device according to claim 21, further comprising:*

*a fifth word line disposed above the second word line,*

*wherein the control circuit applies the second voltage to the fifth word line in the erase operation.*

*27. The device according to claim 23, wherein a width of a part of the first silicon material at the position which the first word line is disposed is narrower than a width of a part of the first silicon material at the position which the second word line is disposed.*

*28. The device according to claim 27, wherein the first voltage is higher than the second voltage.*

*29. The device according to claim 21, wherein a part of a first period overlaps part of a second period, the first voltage is applied in the first period, and the second voltage is applied in the second period.*

*30. The device according to claim 21, the first memory string including:*

*a first silicon material extending in a first direction crossing to a semiconductor substrate;*

*a first memory portion provided between the first silicon material and the first word line; and*

*a second memory portion provided between the first silicon material and the second word line.*

*31. The device according to claim 30, wherein the first silicon material functions as a body of the first memory cell and the second memory cell, the first memory portion is part of the first memory cell, and the second memory portion is part of the second memory cell.*

*32. The device according to claim 30, further comprising:*

*a second silicon material extending in the first direction and adjacent to the first silicon material;*

*a first wiring connecting to one end of the first silicon material;*

*a second wiring connecting to one end of the second silicon material;*

*a sixth word line and a seventh word line arranged in the first direction, and the sixth word line being disposed in a same level as the first word line and the seventh word line being disposed in a same level as the second word line.*

*33. The device according to claim 32, further comprising:*

*a connection portion connecting the second silicon material and the first silicon material; and*

*a second gate electrode disposed on a first insulating film;*

*wherein, in the erase operation, the control circuit applies a sixth voltage different from the third voltage to the second gate electrode.*

*34. The device according to claim 32, further comprising:*

*a first select gate transistor having a first gate electrode, one end of the first select gate transistor connecting to the first silicon material and the other end of the first select gate transistor connecting to the first wiring;*

*a second select gate transistor having a third gate electrode, one end of the second select gate transistor connecting to the second silicon material and the other end of the second select gate transistor connecting to the second wiring;*

*wherein the control circuit applies a fourth voltage different from the third voltage to the first gate electrode in the erase operation.*

*35. The device according to claim 34, wherein, in the erase operation, the control circuit applies the third voltage to the second wiring and apply the fourth voltage to the third gate electrode.*

*36. The device according to claim 34, wherein the control circuit sets the third gate electrode and the second wiring in floating state in the erase operation.*

*37. The device according to claim 32, further comprising:*

*a third silicon material extending in the first direction and adjacent to the second silicon material;*

*an eighth word line and a ninth word line disposed above the eighth word line, and the eighth word line disposed*

*in a same level as the first word line and the ninth word line disposed in a same level as the second word line;*

*the sixth word line connecting to the eighth word line and separated from the first word line, and*

*the seventh word line connecting to the ninth word line and separated from the second word line.*

* * * * *